US012672292B2

(12) United States Patent
Koo et al.

(10) Patent No.: US 12,672,292 B2
(45) Date of Patent: Jun. 30, 2026

(54) SEMICONDUCTOR DEVICE INCLUDING A PLURALITY OF DIELECTRIC LAYERS STACKED ON FERROELECTRIC LAYER

(71) Applicant: SK hynix Inc., Icheon-si (KR)

(72) Inventors: Won Tae Koo, Icheon-si (KR); Dong Ik Suh, Icheon-si (KR); Se Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 971 days.

(21) Appl. No.: 17/749,127

(22) Filed: May 19, 2022

(65) Prior Publication Data

US 2023/0098622 A1 Mar. 30, 2023

(30) Foreign Application Priority Data

Sep. 24, 2021 (KR) ........................ 10-2021-0126755

(51) Int. Cl.
*H10B 53/30* (2023.01)
*H10B 51/30* (2023.01)
*H10D 1/68* (2025.01)

(52) U.S. Cl.
CPC ............. *H10B 53/30* (2023.02); *H10B 51/30* (2023.02); *H10D 1/684* (2025.01); *H10D 1/696* (2025.01)

(58) Field of Classification Search
CPC ........ H10B 53/30; H10B 51/30; H10B 41/30; H10B 53/00; H10B 51/00; H10D 1/684; H10D 1/696
See application file for complete search history.

(56) References Cited

U.S. PATENT DOCUMENTS

| | | | | |
|---|---|---|---|---|
| 11,322,578 | B2 * | 5/2022 | Lim | H10D 1/684 |
| 11,469,310 | B2 * | 10/2022 | Maeng | H10B 51/20 |
| 11,791,372 | B2 * | 10/2023 | Lee | H01L 23/66 |
| | | | | 361/301.1 |
| 12,310,039 | B2 * | 5/2025 | Koo | H10B 53/30 |
| 2008/0048227 | A1 * | 2/2008 | Hwang | H01L 21/0228 |
| | | | | 257/295 |
| 2009/0087623 | A1 | 4/2009 | Brazier et al. | |
| 2018/0247997 | A1 | 8/2018 | Zelner et al. | |
| 2019/0318774 | A1 * | 10/2019 | Kittl | H10B 53/30 |
| 2020/0020780 | A1 | 1/2020 | Kim | |
| 2020/0035807 | A1 | 1/2020 | Chen et al. | |
| 2020/0194443 | A1 | 6/2020 | Lin et al. | |
| 2021/0098618 | A1 | 4/2021 | Hsu et al. | |

FOREIGN PATENT DOCUMENTS

| | | |
|---|---|---|
| CN | 110137180 A | 8/2019 |
| CN | 111668218 A | 9/2020 |
| KR | 10-2014-0004855 A | 1/2014 |
| KR | 1020150031380 A | 3/2015 |

(Continued)

*Primary Examiner* — Alonzo Chambliss

(57) ABSTRACT

A semiconductor device includes a first electrode, a ferroelectric layer disposed on the first electrode and implementing a negative capacitance, a dielectric structure disposed on the ferroelectric layer and including a first dielectric layer and a second dielectric layer that are alternately stacked, and a second electrode disposed on the dielectric structure. The ferroelectric layer and the dielectric structure are configured to be electrically connected in series to each other. The ferroelectric layer and dielectric structure together have a non-ferroelectric property.

23 Claims, 24 Drawing Sheets

1

(56) References Cited

FOREIGN PATENT DOCUMENTS

| KR | 10-2018-0097377 | A | 8/2018 |
| KR | 10-2018-0105530 | A | 9/2018 |
| KR | 10-2019-0134910 | A | 12/2019 |
| KR | 10-2020-0036600 | A | 4/2020 |
| KR | 10-2020-0084469 | A | 7/2020 |
| KR | 10-2021-0142356 | A | 11/2021 |

* cited by examiner

8

SEMICONDUCTOR DEVICE INCLUDING A PLURALITY OF DIELECTRIC LAYERS STACKED ON FERROELECTRIC LAYER

CROSS-REFERENCE TO RELATED APPLICATIONS

The present application claims priority under 35 U.S.C. § 119(a) to Korean Application No. 10-2021-0126755, filed on Sep. 24, 2021 in the Korean Intellectual Property Office, which is incorporated herein by reference in its entirety.

BACKGROUND

1. Technical Field

The present disclosure generally relates to a semiconductor device, and more particularly, to a semiconductor device including a ferroelectric layer and a non-ferroelectric layer, and a method of manufacturing the same.

2. Related Art

As the feature size of semiconductor chips decreases, the sizes of capacitor devices and transistor devices disposed in the semiconductor chip are also decreasing. However, the capacitance required for a dielectric layer that constitutes the capacitor device or transistor device needs to maintain a certain reference value to ensure reliability of device operation. Accordingly, various methods for increasing the capacitance of the dielectric layer used in the capacitor device and transistor device have been studied.

As a representative example, a high-k material has been utilized in the dielectric layer of the device. However, as the trend of decreasing the feature size of the semiconductor chip continues, research continues on new candidates for the high-k materials that satisfy the capacitance requirements and have a lower leakage current and a higher breakdown voltage.

SUMMARY

A semiconductor device according to an embodiment of the present disclosure includes a first electrode, a ferroelectric layer disposed on the first electrode that implements a negative capacitance, a dielectric structure disposed on the ferroelectric layer and including a first dielectric layer and a second dielectric layer, and a second electrode disposed on the dielectric structure. The ferroelectric layer and the dielectric structure are electrically connected in series to each other. The ferroelectric layer and dielectric structure together have a non-ferroelectric property.

A semiconductor device according to another embodiment of the present disclosure includes a substrate, a storage node electrode disposed over the substrate, a plate electrode disposed to be spaced apart from the storage node electrode, a ferroelectric layer and a dielectric structure disposed between the storage node electrode and the plate electrode. The dielectric structure includes first dielectric layers and second dielectric layers that are alternatively stacked.

A semiconductor device according to another embodiment of the present disclosure includes a first electrode, a first ferroelectric layer disposed on the first electrode layer that implements a negative capacitance, a dielectric structure disposed on the ferroelectric layer and having a superlattice structure, and a second electrode disposed on the dielectric structure.

In a method of manufacturing a semiconductor device according to yet another embodiment of the present disclosure, a first electrode is formed on a substrate. A ferroelectric layer implementing a negative capacitance is formed on the first electrode. A dielectric structure having a non-ferroelectric property is formed on the ferroelectric layer. A second electrode is formed on the dielectric structure. The forming dielectric structure includes forming a superlattice structure by alternately stacking first dielectric layers and second dielectric layers.

In a method of manufacturing a semiconductor device according to still yet another embodiment of the present disclosure, a first electrode is formed on a substrate. A dielectric structure having a non-ferroelectric property is formed on the first electrode. A ferroelectric layer implementing a negative capacitance is formed on the ferroelectric layer. A second electrode is formed on the dielectric structure. Forming the dielectric structure includes forming a superlattice structure by alternately stacking first dielectric layers and second dielectric layers.

DETAILED DESCRIPTION

Figure 1:
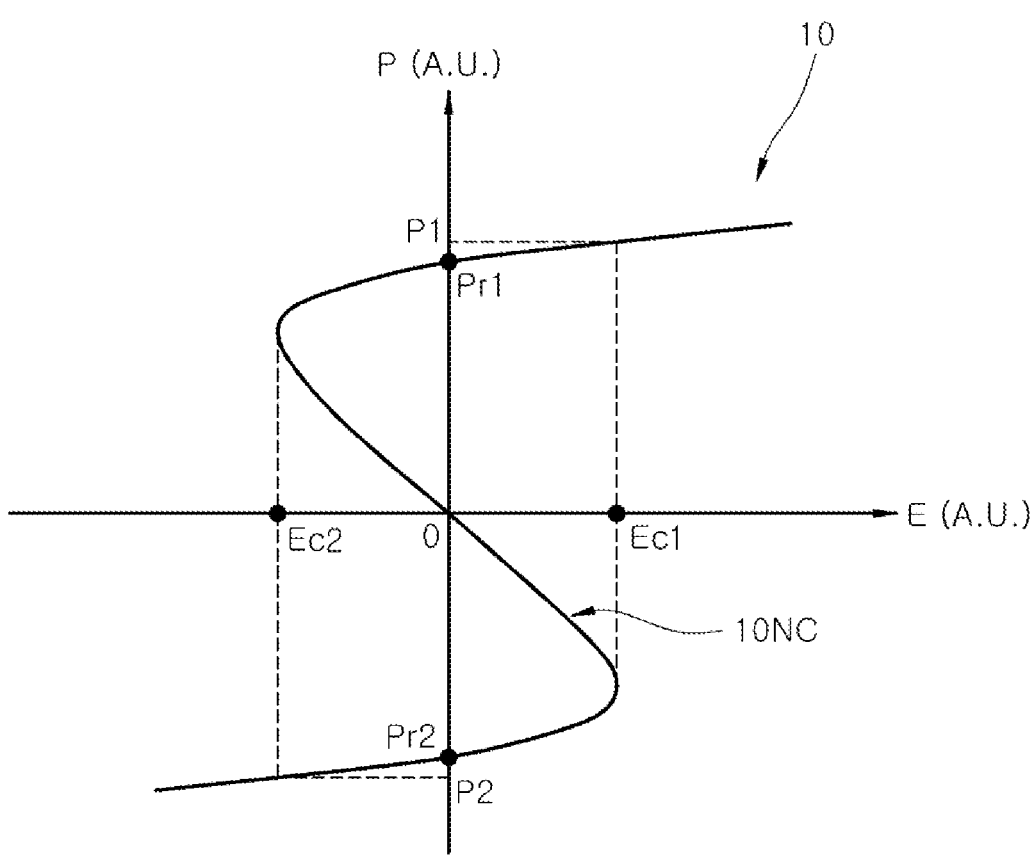
FIG. 1 is a graph schematically illustrating a polarization property of a ferroelectric layer according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

Figure 2:
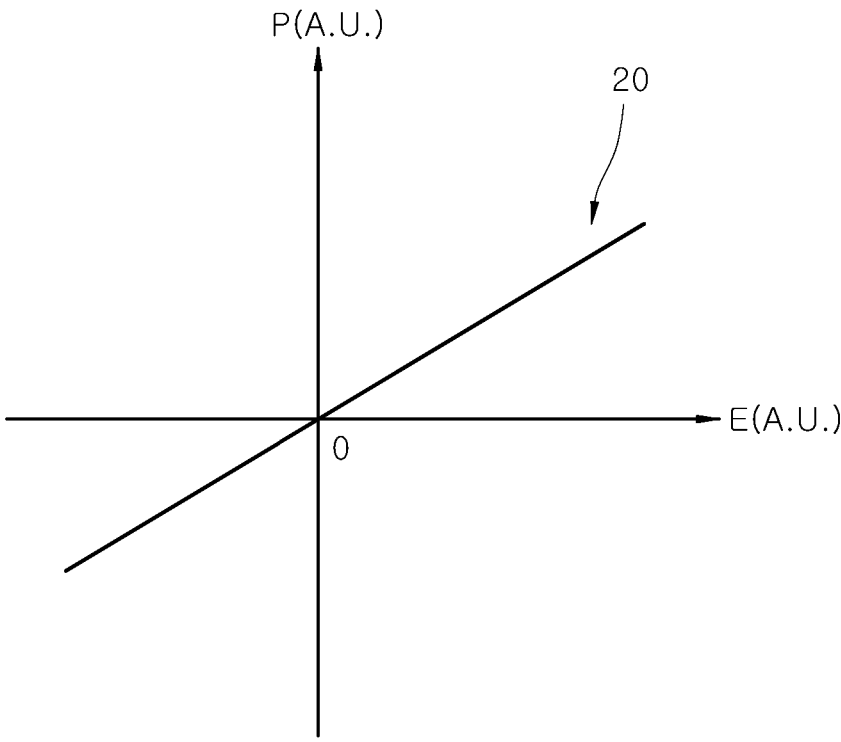
FIG. 2 is a graph schematically illustrating a polarization property of a dielectric layer according to an embodiment of the present disclosure.

FIG. 1 is a graph schematically illustrating a polarization property of a ferroelectric layer according to an embodiment of the present disclosure. Specifically, a graph 10 of FIG. 1 is a graph illustrating the polarization change of a ferroelectric layer when an electric field is applied to both ends of the ferroelectric layer. FIG. 2 is a graph schematically illustrating a polarization property of a dielectric layer according to an embodiment of the present disclosure. Specifically, a graph 20 of FIG. 2 is a graph illustrating the polarization change of a dielectric layer when an electric field is applied to both ends of the dielectric layer.

Referring to the graph 10 of FIG. 1, the ferroelectric layer may have first and second remanent polarization Pr1 and Pr2 and first and second coercive fields Ec1 and Ec2. Each of the first and second remanent polarization Pr1 and Pr2 may be polarization maintained in the ferroelectric layer in a state in which no electric field is applied to the ferroelectric layer. Each of the first and second coercive fields Ec1 and Ec2 may be an electric field required to switch the polarization orientation of the ferroelectric layer in opposite directions.

Referring to the graph 10 of FIG. 1, in an embodiment, when the ferroelectric layer has the second remanent polarization Pr2 in an initial state, an electric field having a positive polarity may be applied to the ferroelectric layer. The electric field may be applied to the ferroelectric layer while increasing the intensity of the electric field in a sweep method. When the electric field reaches the first coercive field Ec1, the polarization state of the ferroelectric layer may be changed to have the first polarization P1 after passing through a negative slope portion 10NC on the graph 10.

The capacitance of the ferroelectric layer may be proportional to the ratio $\Delta P/\Delta E$ of a polarization change $\Delta P$, which depends on the electric field change $\Delta E$ on the graph 10. Accordingly, in an electric field section corresponding to the negative slope portion 10NC of the graph 10, the ferroelectric layer may implement a negative capacitance. That is, when the ferroelectric layer performs polarization switching at the first coercive field Ec1, the ferroelectric layer may move through a portion of the graph 10 that implements the negative capacitance. Conversely, in the remaining portion of the graph 10 of FIG. 1, except for the negative slope portion 10NC, the ferroelectric layer may have a positive capacitance.

Referring to the graph 20 of FIG. 2, the graph 20 illustrates a polarization behavior of the dielectric layer according to an electric field. In this specification, unless otherwise specified, the dielectric layer may mean a non-ferroelectric layer. As an example, the dielectric layer may be a paraelectric layer.

Referring to the graph 20, when an electric field is applied to opposite ends of the dielectric layer while sweeping in a positive direction or a negative direction, the polarization of the dielectric layer may increase from zero in proportion to the applied electric field. When the electric field is removed from the dielectric layer, the magnitude of the polarization may return to zero. That is, when no electric field is applied to the dielectric layer, the dielectric layer may maintain a state in which no polarization formed by an applied electric field is retained.

Meanwhile, the capacitance of the dielectric layer may be proportional to the ratio $\Delta P/\Delta E$ of the polarization change $\Delta P$ depending on an electric field change $\Delta E$ on the graph 20. Accordingly, the dielectric layer associated with the graph 20 of FIG. 2 may have a positive capacitance.

Although not necessarily described as being limited to any one theory, when the ferroelectric layer is bonded to a dielectric layer to form a layer structure, the ferroelectric layer in the layer structure may more stably implement a negative capacitance, compared to a case in which the ferroelectric layer is a standalone single layer. The layer structure, in which the ferroelectric layer and the dielectric layer are bonded, however, might not exhibit a ferroelectric property. That is, the layer structure may have no remanent polarization. As an example, the layer structure may have paraelectricity.

Figure 3:
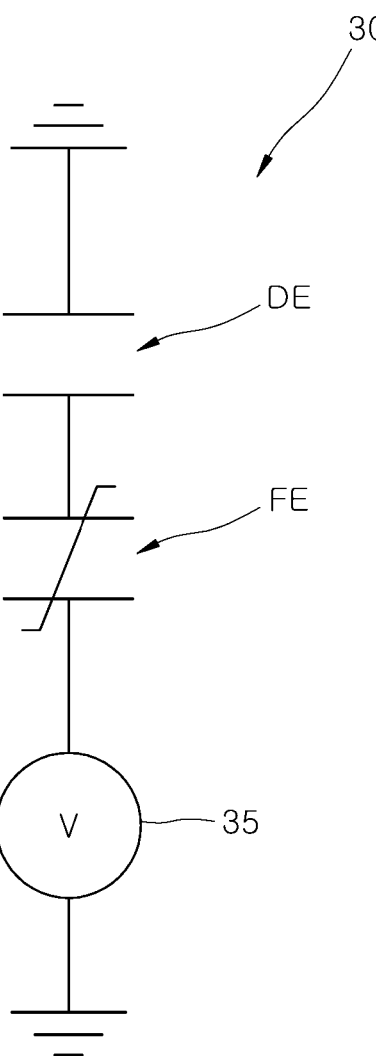
FIG. 3 is a view schematically illustrating an electrical circuit configuration of a dielectric structure according to an embodiment of the present disclosure.

FIG. 3 is a view schematically illustrating an electrical circuit configuration of a layer structure according to an embodiment of the present disclosure. Referring to FIG. 3, a layer structure 30 may include a dielectric layer DE and a ferroelectric layer FE that are configured to be electrically connected in series to each other. When a voltage is applied to both ends of the layer structure 30 by a power supply 35, the capacitance $C_T$ of the layer structure 30 may be calculated by the following equation (1).

$$1/(C_T)=1/(C_{DE})+1/(C_{FE}) \tag{1}$$

Here, $C_{DE}$ may be the capacitance of the dielectric layer DE, and $C_{FE}$ may be the capacitance of the ferroelectric layer FE. When the dielectric layer DE and the ferroelectric layer FE have positive capacitances, the capacitance $C_T$ of the layer structure 30 may be smaller than each of the capacitances $C_{DE}$ and $C_{FE}$ of the dielectric layer DE and the ferroelectric layer FE, respectively.

Meanwhile, when the dielectric layer DE has a positive capacitance and the ferroelectric layer FE has a negative capacitance in a certain voltage range, the capacitance $C_T$ of the layer structure 30 may be greater than the capacitance of the dielectric layer DE. As such, when the ferroelectric layer FE and the dielectric layer DE are electrically connected in series to each other to form the layer structure 30, the capacitance $C_T$ of the layer structure 30 may be higher than the capacitance $C_{DE}$ of the dielectric layer DE.

Accordingly, as described in various embodiments below, it is possible to enable semiconductor devices with capacitance greater than that of the dielectric layer DE within a certain operation voltage range by arranging the dielectric layer DE and the ferroelectric layer FE electrically in series to form the structure 30.

Figure 4:
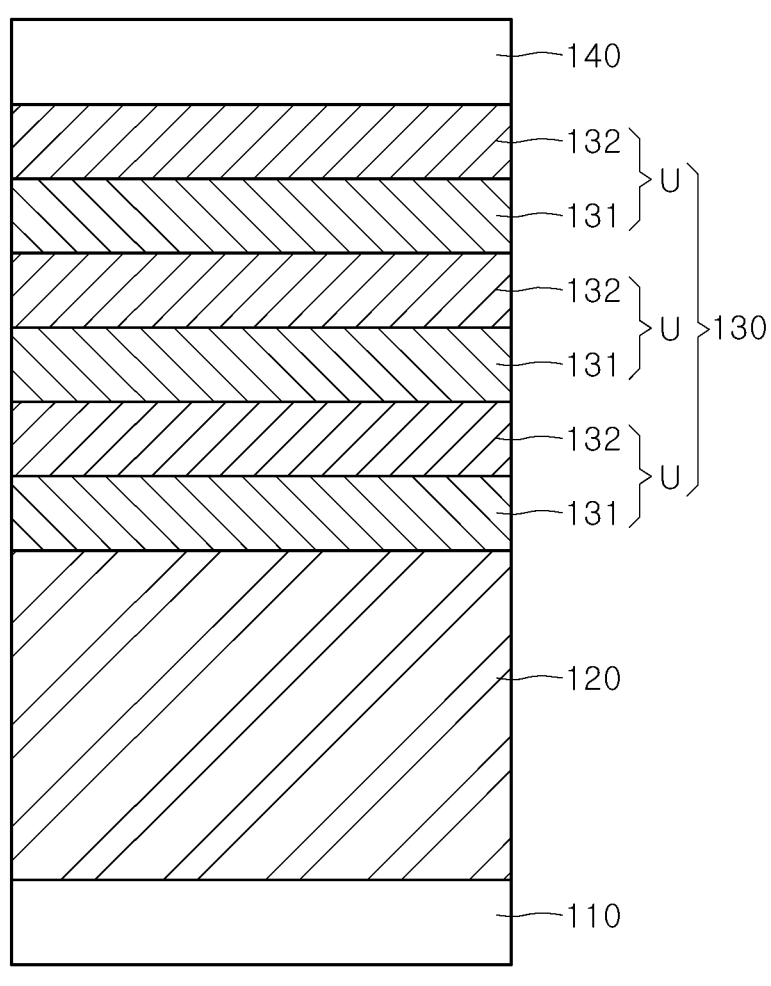
FIG. 4 is a cross-sectional view illustrating a semiconductor device according to an embodiment of the present disclosure.

FIG. 4 is a cross-sectional view illustrating a semiconductor device according to an embodiment of the present disclosure. Referring to FIG. 4, a semiconductor device 1 may include a first electrode 110, a ferroelectric layer 120 disposed on the first electrode 110, a dielectric structure 130 disposed on the ferroelectric layer 120, and a second electrode 140 disposed on the dielectric structure 130. The ferroelectric layer 120 and the dielectric structure 130 in the semiconductor device 1 may be configured to be electrically connected to each other in series. The device structure including the ferroelectric layer 120 and the dielectric structure 130 connected in series may have a non-ferroelectric property as a whole. In the present specification, a non-ferroelectric property may mean that a dielectric material has no remanent polarization and no coercive field. As an example, the non-ferroelectric property may mean paraelectricity.

The first electrode 110 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 4, the ferroelectric layer 120 may be disposed on the first electrode 110. The ferroelectric layer 120 may have a ferroelectric property of the ferroelectric layer described with reference to FIG. 1. As an example, the ferroelectric layer 120 may have remanent polarization and a coercive field. In addition, the ferroelectric layer 120 may implement a negative capacitance under a certain range of electric fields.

In an embodiment, the ferroelectric layer 120 may include hafnium oxide, hafnium zirconium oxide, or a combination thereof. In another embodiment, the ferroelectric layer 120 may include hafnium oxide doped with a dopant, hafnium zirconium oxide doped with a dopant, or a combination thereof. The dopant may stabilize the ferroelectric property of the ferroelectric layer 120. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

In an embodiment, the ferroelectric layer 120 may have a crystal structure of the orthorhombic crystal system. The ferroelectric layer 120 may have a thickness of, for example, 1 nanometer (nm) to 4 nanometers (nm). The ferroelectric layer 120 may have a single crystalline structure or a polycrystalline structure. In an embodiment, the ferroelectric layer 120 may be an epi-growth layer. The ferroelectric layer 120 may be formed by, for example, an atomic layer deposition method, a pulsed layer deposition method, or a chemical vapor deposition method.

Referring to FIG. 4, the dielectric structure 130 may be disposed on the ferroelectric layer 120. The dielectric structure 130 may have a thickness of, for example, 1 nanometer (nm) to 4 nanometers (nm). The dielectric structure 130 may include first dielectric layers 131 and second dielectric layers 132, which are alternately stacked. Each of the first dielectric layer 131 and the second dielectric layer 132 may have a thickness of, for example, 5 angstroms (Å) to 20 angstroms (Å). The dielectric structure 130 may have a superlattice structure that includes the first dielectric layers 131 and the second dielectric layers 132.

In an embodiment, the dielectric structure 130 may include a plurality of unit stacks U. Although three unit stacks U are illustrated in FIG. 4, the present disclosure is not necessarily limited thereto, and two or more different number of unit stacks U may be included in other embodiments. Each of the plurality of unit stacks U may include one layer of the first dielectric layer 131 and one layer of the second dielectric layer 132.

In an embodiment, each of the first dielectric layer 131 and the second dielectric layer 132 may be an epi-growth layer having a non-ferroelectric property. As an example, each of the first dielectric layer 131 and the second dielectric layer 132 may have paraelectricity. That is, each of the first dielectric layer 131 and the second dielectric layer 132 may be a paraelectric layer. The epi-growth layer may be formed by, for example, an atomic layer deposition method, a pulsed layer deposition method, or a chemical vapor deposition method.

In an embodiment, one dielectric layer of the layers in a unit stack U may include hafnium oxide, and the other dielectric layer may include zirconium oxide. The first dielectric layer 131 may have a crystal structure of the monoclinic crystal system or the tetragonal crystal system. Similarly, the second dielectric layer 132 may have a crystal structure of the monoclinic crystal system or the tetragonal crystal system.

In an embodiment, the ferroelectric layer 120 and the first dielectric layer 131 may include the same type of metal, and the ferroelectric layer 120 and the second dielectric layer 132 may include the same type of a different metal. For example, if the ferroelectric layer 120 may include hafnium zirconium oxide, then the first dielectric layer 131 may include hafnium oxide and the second dielectric layer 132 may include zirconium oxide. That is, the ferroelectric layer 120 and the first dielectric layer 131 may include hafnium, and the ferroelectric layer 120 and the second dielectric layer 132 may include zirconium.

The first dielectric layer 131 and the second dielectric layer 132 may have different lattice constants. Accordingly, due to the lattice constant difference, strain may occur at interfaces between the alternately stacked first and second dielectric layers 131 and 132. The strain may generate a flexoelectric effect in the dielectric structure 130. When an electric field is applied to the dielectric structure 130, the flexoelectric effect may enhance the polarization orientation of the dielectric structure 130 along the electric field. As the polarization orientation is enhanced, the permittivity of the dielectric structure 130 may increase. As a result, the capacitance of the dielectric structure 130 may be increased.

Referring again to FIG. 4, the second electrode 140 may be disposed on the dielectric structure 130. The second electrode 140 may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Figure 5:
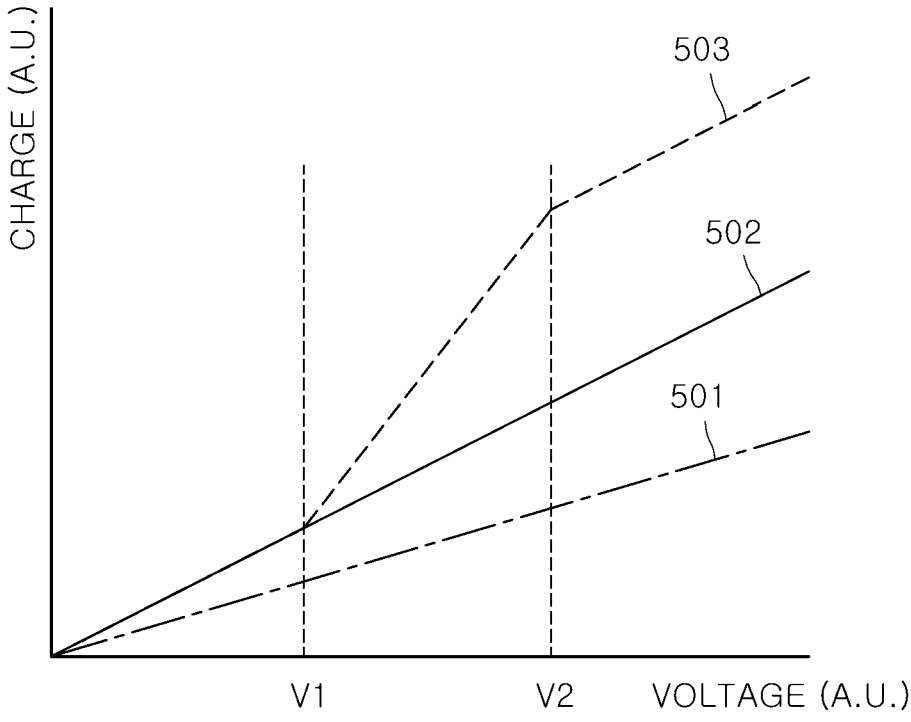
FIG. 5 is a graph schematically illustrating a result of a simulation for amounts of electric charges of semiconductor devices according to applied voltages.

FIG. 5 is a graph schematically illustrating a result of a simulation for amounts of electric charges of semiconductor devices according to applied voltages. First to third graphs 501, 502, and 503 may be obtained through the following process. First, first to third semiconductor devices in which different first to third structures are respectively disposed between a pair of electrodes may be prepared. The first to third structures may have the same thickness. Then, a varying pulse voltage may be applied to each of the first to third semiconductor devices, and the amount of electric charges charged in the first to third structures may be derived according to the applied pulse voltage. In each of the first to third graphs 501, 502, and 503, the charge amount change $\Delta Q$ according to the voltage change $\Delta V$, that is, the slope of each of the first to third graphs 501, 502, and 503 may correspond to a capacitance of each of the first to third structures, respectively. The first and second semiconductor devices may correspond to comparative examples of the present disclosure, and the third semiconductor device may correspond to an embodiment of the present disclosure.

The first graph 501 of FIG. 5 may represent a charging characteristic of the first semiconductor device including the first structure. The first structure may be formed as a zirconium oxide layer. The second graph 502 may represent a charging characteristic of the second semiconductor device including the second structure. The second structure may have a superlattice structure in which a plurality of zirconium oxide layers and a plurality of hafnium oxide layers are alternately stacked. The third graph 503 may represent an electrical characteristic of the third semiconductor device including the third structure. The third structure may have a structure in which a dielectric structure and a ferroelectric layer are connected in series to each other. The dielectric structure may have a superlattice structure in which a plurality of zirconium oxide layers and a plurality of hafnium oxide layers are alternately stacked. The ferroelectric layer may be a hafnium zirconium oxide layer.

The first to third structures may each have a thickness of 5 nanometers (nm). In the third structure, the dielectric structure and the ferroelectric layer may have a thickness of 3 nanometers (nm) and 2 nanometers (nm), respectively. In the second and third structures, the one layer of zirconium oxide layer and the one layer of hafnium oxide layer may each have a thickness of 5 angstroms (Å).

Referring to FIG. 5, in the entire voltage range, the amount of the charged electric charges of the second graph 502 is greater than the amount of the charged electric charges of the first graph 501. That is because, as described above, the flexoelectric effect occurring between the zirconium oxide layer and the hafnium oxide layer increases the capacitance of the second structure, so the amount of the charged electric charges of the second structure along the second graph 502 may be greater than the amount of the charged electric charges of the first structure along the first graph 501. The amount of the charged electric charges of the third graph 503 may be substantially the same as the amount of the charged electric charges of the second graph 502 below the first voltage V1. The amount of the charged electric charges of the third graph 503 may be greater than the amount of the charged electric charges of the second graph 502 in a voltage range in which the applied voltage is greater than the first voltage V1.

Meanwhile, the charge amount change $\Delta Q$ according to the voltage change $\Delta V$ of the third graph 503, that is, the slope of the third graph 503, may correspond to the capacitance of the third structure within a voltage range. The capacitance of the third structure may be substantially the same as the capacitance of the second structure in a voltage range less than the first voltage V1.

The capacitance of the third structure may increase in a voltage range between the first voltage V1 and the second voltage V2. As a result, the capacitance of the third structure may be greater than the capacitance of the second structure. As described with reference to FIG. 1, in the voltage range between the first voltage V1 and the second voltage V2, because the ferroelectric layer in the third structure exhibits a negative capacitance while performing polarization switching, the overall capacitance of the third structure increases. As the capacitance of the third structure increases between the first voltage V1 and the second voltage V2, the charge amount change $\Delta Q$ of the third structure may also increase.

After the polarization switching of the ferroelectric layer is completed, the ferroelectric layer exhibits a positive capacitance, so the capacitance of the third structure may decrease in a voltage range greater than or equal to the second voltage V2.

Consequently, referring to FIG. 5, the third semiconductor device having the third structure according to an embodiment of the present disclosure may exhibit a higher amount of charged charges than the first and second semiconductor devices in a voltage range greater than or equal to the first voltage V1.

Figure 6:
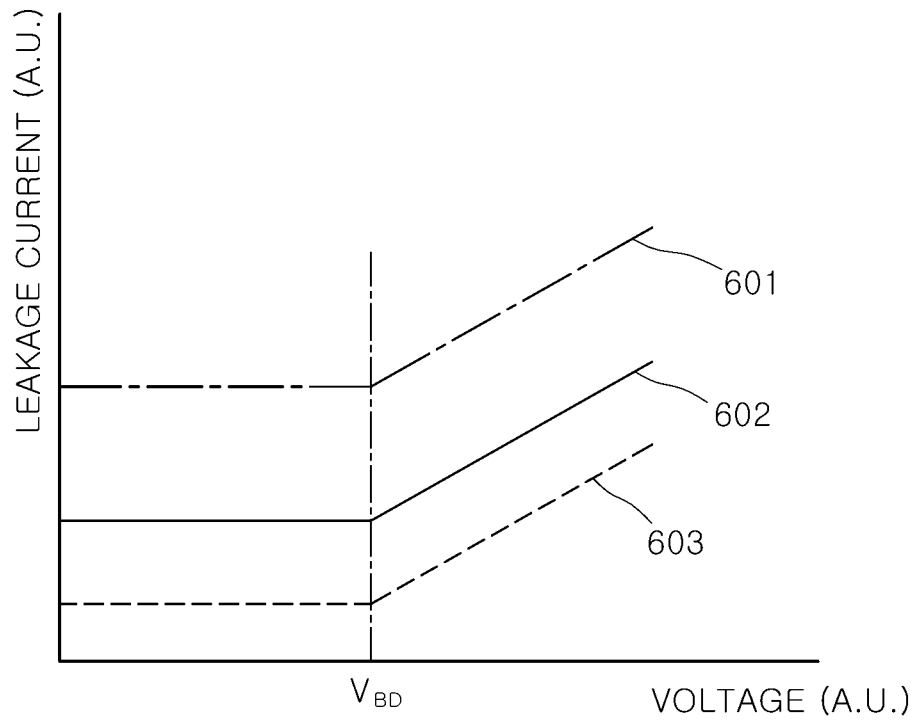
FIG. 6 is a graph schematically illustrating a result of a simulation of leakage current of semiconductor devices according to applied voltages.

FIG. 6 is a graph schematically illustrating a result of a simulation for leakage current of semiconductor devices according to applied voltages. Fourth to sixth graphs 601, 602, and 603 of FIG. 6 may be obtained through the following process. First, fourth to sixth semiconductor devices may be prepared in which different fourth to sixth structures are respectively disposed between a pair of electrodes. Then, a varying pulse voltage may be applied to each of the fourth to sixth semiconductor devices, and leakage currents generated from the fourth to sixth structures may be derived according to the applied pulse voltage.

The thickness of each of the fourth to sixth structures may be set to implement the same capacitance in all three semiconductor devices. For example, the fourth semiconductor device may include the fourth structure, and the fourth structure may include a zirconium oxide layer having a thickness of 2.5 nanometers (nm). The fifth semiconductor device may include the fifth structure and include a dielectric structure having a thickness of 3 nanometers (nm). The dielectric structure may have a superlattice structure in which zirconium oxide layers of about 5 angstroms (Å) and hafnium oxide layers of about 5 angstroms (Å) are alternately stacked. The sixth semiconductor device may include the sixth structure, and may have a structure in which a dielectric structure having a thickness of 3 nanometers (nm) and a ferroelectric layer having a thickness of 2 nanometers (nm) are connected in series to each other. The dielectric structure may have a superlattice structure in which zirconium oxide layers of about 5 angstroms (Å) and hafnium oxide layers of about 5 angstroms (Å) are alternately stacked, and the ferroelectric layer may be a hafnium zirconium oxide layer.

Referring to FIG. 6, the leakage current of the sixth structure having the greatest physical thickness appears to be the lowest. As a result, the sixth semiconductor device according to an embodiment of the present disclosure may exhibit the lowest leakage current for the same capacitance among the fourth to sixth semiconductor devices. Meanwhile, in the fourth to sixth graphs 601, 602, and 603, when the applied voltage is equal to or greater than a threshold voltage $V_{BD}$, a weak level of breakdown may occur and the leakage current may be increased.

Figure 7:
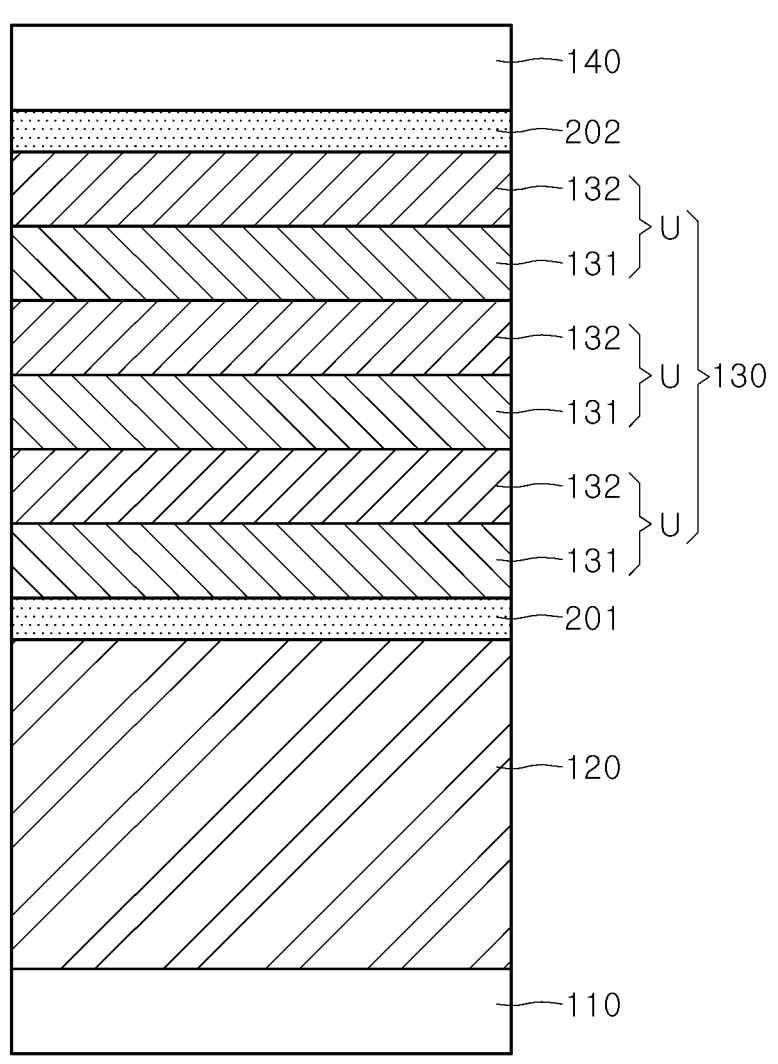
FIG. 7 is a cross-sectional view schematically illustrating a semiconductor device according to another embodiment of the present disclosure.

FIG. 7 is a cross-sectional view schematically illustrating a semiconductor device according to another embodiment of the present disclosure. A semiconductor device 2 of FIG. 7 may further include first and second barrier insulation layers 201 and 202 compared to a semiconductor device 1 of FIG. 4.

The first barrier insulation layer 201 may be disposed between a ferroelectric layer 120 and a dielectric structure 130. The first barrier insulation layer 201 may suppress material exchange between the ferroelectric layer 120 and the dielectric structure 130. Accordingly, alteration of the material composition of the ferroelectric layer 120 and the first and second dielectric layers 131 and 132 may be prevented or suppressed. As a result, ferroelectric properties of the ferroelectric layer 120 may be stabilized, and also non-ferroelectric properties of the dielectric structure 130 may be stabilized. Accordingly, the effect of increasing capacitance by connecting the ferroelectric layer 120 and the dielectric structure 130 in series may be more reliably implemented in the semiconductor device 2.

In addition, the first barrier insulation layer 201 may have a band gap energy that is greater than that of the ferroelectric layer 120 and of the first and second dielectric layers 131 and 132. Accordingly, the first barrier insulation layer 201 may form a potential barrier between the ferroelectric layer 120 and the dielectric structure 130. As a result, the first barrier insulation layer 201 may reduce the leakage current generated at an interface between the ferroelectric layer 120 and the dielectric structure 130 during the operation of the semiconductor device 2. Consequently, the breakdown voltage of the semiconductor device 2 may increase.

In an embodiment, the first barrier insulation layer 201 may have an amorphous structure. However, the thickness of the first barrier insulation layer 201 may be thin, so that the crystal structure of the first dielectric layer 131 in contact with the first barrier insulation layer 201 may be influenced by the crystal structure of the ferroelectric layer 120. As a result, the first dielectric layer 131 may grow into an epitaxial structure when the dielectric structure 130 is formed. That is, the first dielectric layer 131 may have a crystal structure similar to that of the ferroelectric layer 120, even though the first barrier insulation layer 201 is interposed therebetween, because the first barrier insulation layer 201 is sufficiently thin. However, the crystal structure of the first dielectric layer 131 is not the same as the crystal structure of the ferroelectric layer 120. As an example, the ferroelectric layer 120 may have an orthorhombic crystal structure, while the first dielectric layer 131 may have a crystal structure of a monoclinic crystal system or a tetragonal crystal system. The thickness of the first barrier insulation layer 201 may be equal to or less than the thickness of the first dielectric layer 131. The first barrier insulation layer 201 may include, for example, aluminum oxide, yttrium oxide, magnesium oxide, or a combination of two or more thereof.

The second barrier insulation layer 202 may be disposed between the dielectric structure 130 and the second electrode 140. The second barrier insulation layer 202 may suppress or prevent material exchange between the dielectric structure 130 and the second electrode 140. Accordingly, changes in the material composition of the first and second dielectric layers 131 and 132 of the dielectric structure 130 may be prevented or suppressed.

In addition, the band gap energy of the second barrier insulation layer 202 may be greater than the band gap energy of each of the first and second dielectric layers 131 and 132. Accordingly, the second barrier insulation layer 202 may form a potential barrier between the dielectric structure 130 and the second electrode 140. As a result, the second barrier insulation layer 202 may reduce the leakage current generated at an interface between the dielectric structure 130 and the second electrode 140 during the operation of the semiconductor device 2. Consequently, the breakdown voltage of the semiconductor device 2 may increase.

In an embodiment, the second barrier insulation layer 202 may include, for example, aluminum oxide, yttrium oxide, magnesium oxide, or a combination of two or more thereof. The thickness of the second barrier insulation layer 202 may be less than or equal to the thickness of the second dielectric layer 132 in contact with the second barrier insulation layer 202.

In some embodiments, the second barrier insulation layer 202 may be omitted, and the second dielectric layers 132 of the dielectric structure 130 may form a sufficient potential barrier with the second electrode 140. That is, when the leakage current is not generated at an interface between the second dielectric layer 132 of the dielectric structure 130 and the second electrode 140, or if the leakage current is sufficiently suppressed or reduced to an acceptable level, the second barrier insulation layer 202 may be omitted from some embodiments.

Figure 8:
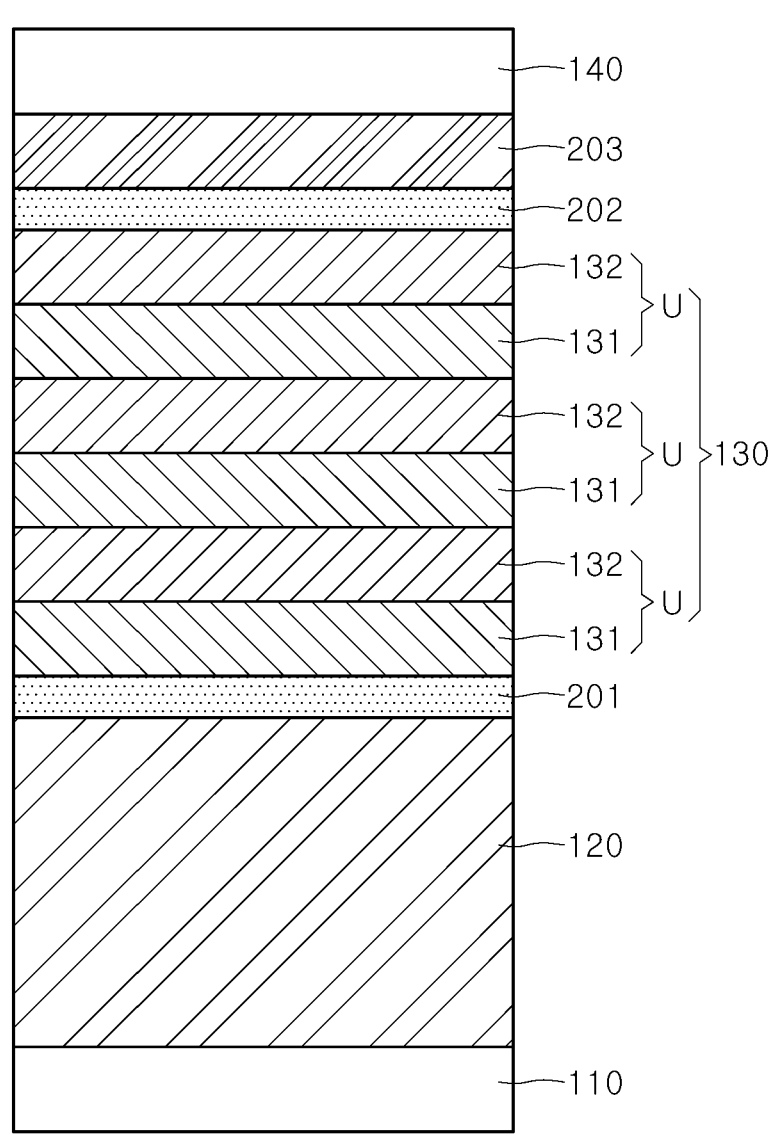
FIG. 8 is a cross-sectional view schematically illustrating a semiconductor device according to another embodiment of the present disclosure.

FIG. 8 is a cross-sectional view schematically illustrating a semiconductor device according to another embodiment of the present disclosure. A semiconductor device 3 may further include a reduction sacrificial layer 203 compared to a semiconductor device 2 described with reference to FIG. 7. The reduction sacrificial layer 203 may be disposed between the second barrier insulation layer 202 and the second electrode 140. The reduction sacrificial layer 203 may serve to suppress or prevent a reaction between the first and second dielectric layers 131 and 132 and the second electrode 140. That is, the reduction sacrificial layer 203 may react with the second electrode 140 to form a compound layer prior to a reduction reaction between the first and second dielectric layers 131 and 132 and the second electrode 140. Accordingly, the material composition of the first and second dielectric layers 131 and 132 may be stable and maintained during operation of the device. The reduction sacrificial layer 203 may include, for example, niobium oxide or titanium oxide.

In some embodiments, when the reduction sacrificial layer 203 forms a sufficiently large potential barrier with the second electrode 140, the second barrier insulation layer 202 may be omitted.

Figure 9:
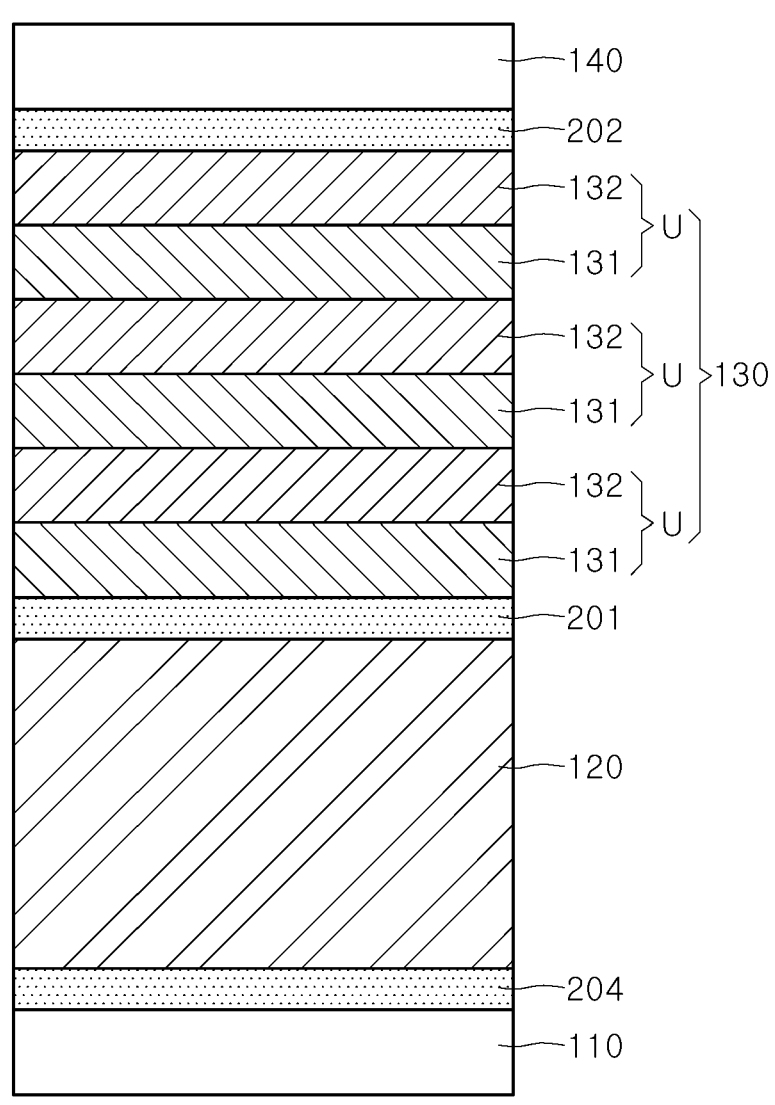
FIG. 9 is a cross-sectional view schematically illustrating a semiconductor device according to another embodiment of the present disclosure.

FIG. 9 is a cross-sectional view schematically illustrating a semiconductor device according to another embodiment of the present disclosure. A semiconductor device 4 may further include a third barrier insulation layer 204 compared to a semiconductor device 2 described with reference to FIG. 7.

The third barrier insulation layer 204 may be disposed between a first electrode 110 and a ferroelectric layer 120. The third barrier insulation layer 204 may suppress material exchange between the first electrode 110 and the ferroelectric layer 120. Accordingly, it is possible to prevent changes to the material composition of the ferroelectric layer 120.

In addition, the band gap energy of the third barrier insulation layer 204 may be greater than the band gap energy of the ferroelectric layer 120. Accordingly, the third barrier insulation layer 204 may form a potential barrier between the first electrode 110 and the ferroelectric layer 120. As a result, the third barrier insulation layer 204 may reduce a leakage current generated at an interface between the first electrode 110 and the ferroelectric layer 120 during the operation of the semiconductor device 4. Consequently, the breakdown voltage of the semiconductor device 4 may increase.

In an embodiment, the third barrier insulation layer 204 may include, for example, aluminum oxide, yttrium oxide, magnesium oxide, or a combination of two or more thereof.

Figure 10:
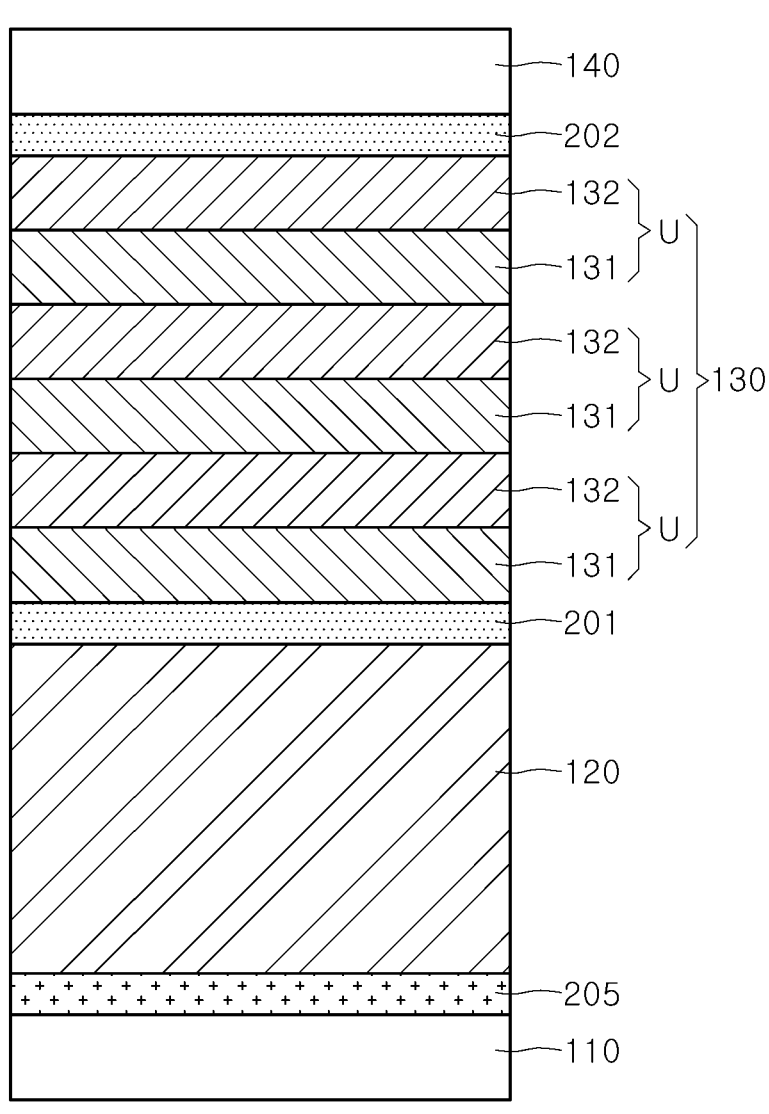
FIG. 10 is a cross-sectional view schematically illustrating a semiconductor device according to another embodiment of the present disclosure.

FIG. 10 is a cross-sectional view schematically illustrating a semiconductor device according to another embodiment of the present disclosure. A semiconductor device 5 of FIG. 10 may further include a crystallization seed layer 205 compared to a semiconductor device 2 described with reference to FIG. 7.

The crystallization seed layer 205 may be disposed between a first electrode 110 and a ferroelectric layer 120. The crystallization seed layer 205 may have a crystalline structure and may induce crystallization of the ferroelectric layer 120. In an embodiment, after the ferroelectric layer 120 is formed as an amorphous material layer on the crystallization seed layer 205, the amorphous material layer may be converted into a crystalline structure through a crystallization heat treatment using the crystallization seed layer 205. The conversion to the crystalline structure may improve ferroelectric properties of the ferroelectric layer 120. The crystallization seed layer 205 may be non-ferroelectric.

In addition, the crystallization seed layer 205 may function as a buffer layer that can reduce a difference in lattice constants between the first electrode 110 and the ferroelectric layer 120. As an example, the lattice constant of the crystallization seed layer 205 may be between the lattice constant of the first electrode 110 and the lattice constant of the ferroelectric layer 120. As a result, the crystallization seed layer 205 may reduce defects that may occur at an interface with direct contact between the first electrode 110 and the ferroelectric layer 120. Accordingly, the crystallization seed layer 205 may reduce a leakage current that may be generated at a direct interface between the first electrode 110 and the ferroelectric layer 120. The crystallization seed layer 205 may include, for example, magnesium oxide or zirconium oxide.

Figure 11:
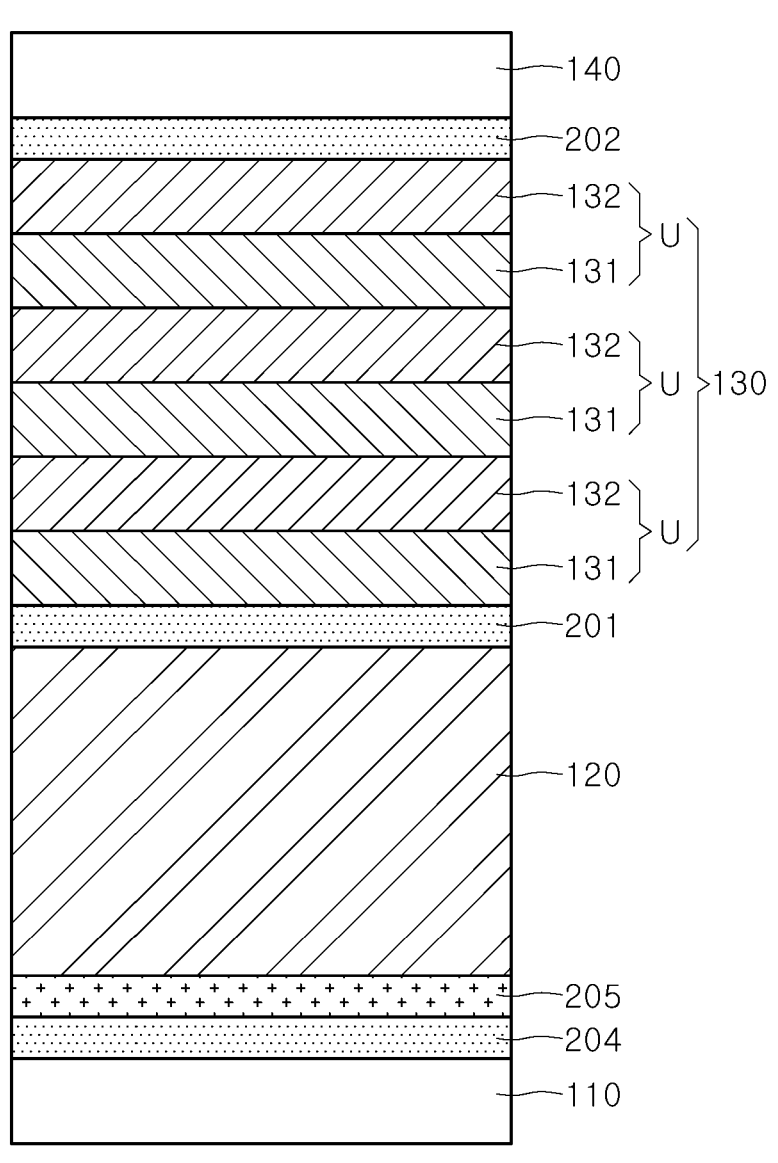
FIG. 11 is a cross-sectional view schematically illustrating a semiconductor device according to another embodiment of the present disclosure.

FIG. 11 is a cross-sectional view schematically illustrating a semiconductor device according to another embodiment of the present disclosure. Referring to FIG. 11, a semiconductor device 6 may further include a third barrier insulation layer 204 disposed between a first electrode 110 and a crystallization seed layer 205, compared to a semiconductor device 5 described with reference to FIG. 10.

Accordingly, in the semiconductor device 6, the function of the third barrier insulation layer 204 of the semiconductor device 4 described above with reference to FIG. 9 and the function of the crystallization seed layer 205 of the semiconductor device 5 described above with reference to FIG. 10 may be performed together.

Figure 12:
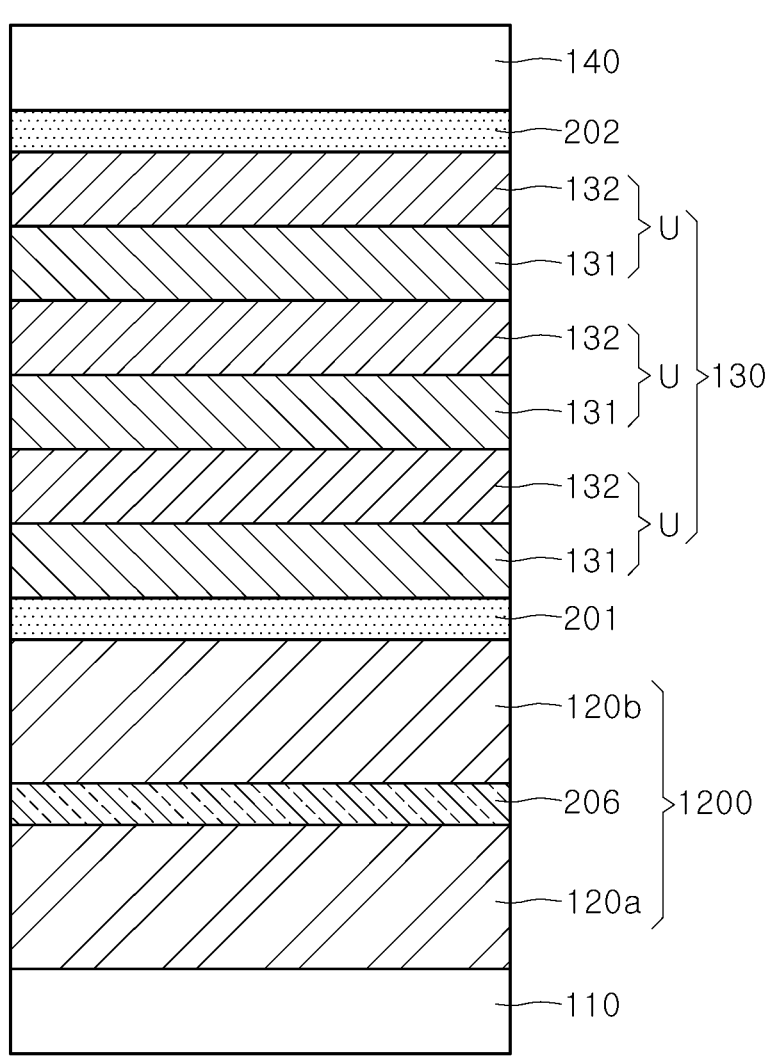
FIG. 12 is a cross-sectional view schematically illustrating a semiconductor device according to another embodiment of the present disclosure.

FIG. 12 is a cross-sectional view schematically illustrating a semiconductor device according to another embodiment of the present disclosure. Referring to FIG. 12, a ferroelectric layer 1200 of a semiconductor device 7 may be differentiated from a ferroelectric layer 120 described in relation to a semiconductor device 2 of FIG. 7. The remaining configurations of the semiconductor device 7, except for the ferroelectric layer 1200, may be the same as those described in connection with the semiconductor device 2.

The ferroelectric layer 1200 may include a first sub ferroelectric layer 120a, an inner barrier layer 206 disposed on the first sub ferroelectric layer 120a, and a second sub ferroelectric layer 120b disposed on the inner barrier layer 206. The first sub ferroelectric layer 120a and the second sub ferroelectric layer 120b may be made of the same material, or may be made of different materials. The first sub ferroelectric layer 120a and the second sub ferroelectric layer 120b may be made of the same material as the ferroelectric layer 120 of a semiconductor device 1 described with reference to FIG. 4.

The inner barrier layer 206 may form a potential barrier between the first sub ferroelectric layer 120a and the second sub ferroelectric layer 120b within the ferroelectric layer 1200. The band gap energy of the inner barrier layer 206 may be greater than the band gap energy of each of the first and second sub ferroelectric layers 120a and 120b. Accordingly, the inner barrier layer 206 may reduce the leakage current of the ferroelectric layer 1200 and increase the breakdown voltage of the ferroelectric layer 1200. The inner barrier layer 206 may include, for example, aluminum oxide, yttrium oxide, magnesium oxide, or a combination of two or more thereof.

Figure 13:
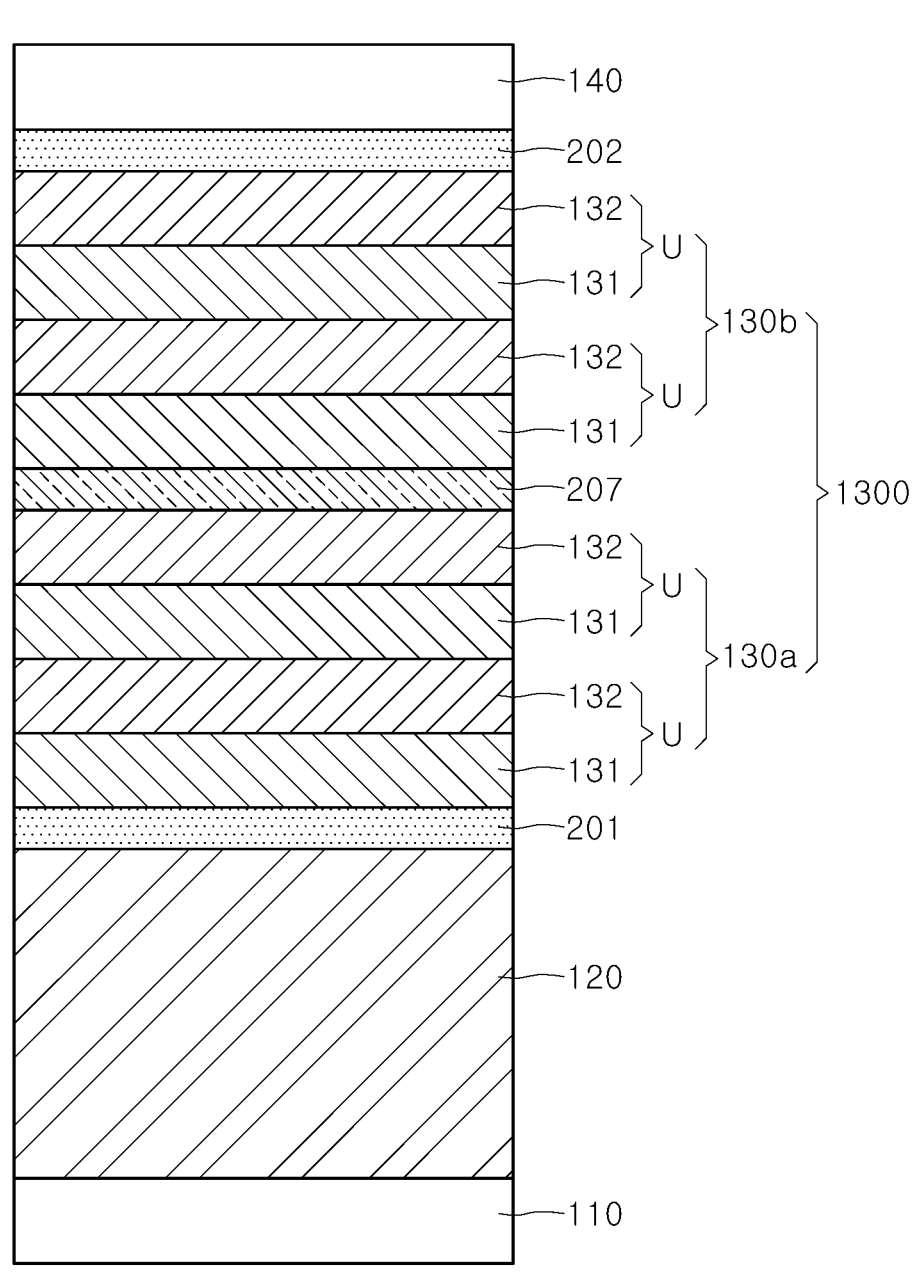
FIG. 13 is a cross-sectional view schematically illustrating a semiconductor device according to another embodiment of the present disclosure.

FIG. 13 is a cross-sectional view schematically illustrating a semiconductor device according to another embodiment of the present disclosure. Referring to FIG. 13, a dielectric structure 1300 of a semiconductor device 8 may be different from a dielectric structure 130 of a semiconductor device 2 described with reference to FIG. 7. Other configurations of the semiconductor device 8, except for the dielectric structure 1300, may be the same as those of the semiconductor device 2.

The dielectric structure 1300 may include a first sub dielectric structure 130a disposed on a first barrier insulation layer 201, an inner barrier layer 207 disposed on the first sub dielectric structure 130a, and a second sub dielectric structure 130b disposed on the inner barrier layer 207.

Each of the first and second sub dielectric structures 130a and 130b may include a plurality of unit stacks U. Although FIG. 13 illustrates the same number of unit stacks U in each of the first and second sub dielectric structures 130a and 130b, the present disclosure is not limited thereto. In other embodiments, the first sub dielectric structure 130a may include a different number of unit stacks U from the second sub dielectric structure 130b.

The inner barrier layer 207 may form a potential barrier between the first sub dielectric structure 130a and the second sub dielectric structure 130b in the dielectric structure 1300. The band gap energy of the inner barrier layer 207 may be greater than the band gap energy of each of the first and second dielectric layers 131 and 132. Accordingly, the inner barrier layer 207 may reduce the leakage current of the dielectric structure 1300 and increase the breakdown voltage of the dielectric structure 1300. The inner barrier layer 207 may include, for example, aluminum oxide, yttrium oxide, magnesium oxide, or a combination of two or more thereof.

Figure 14A:
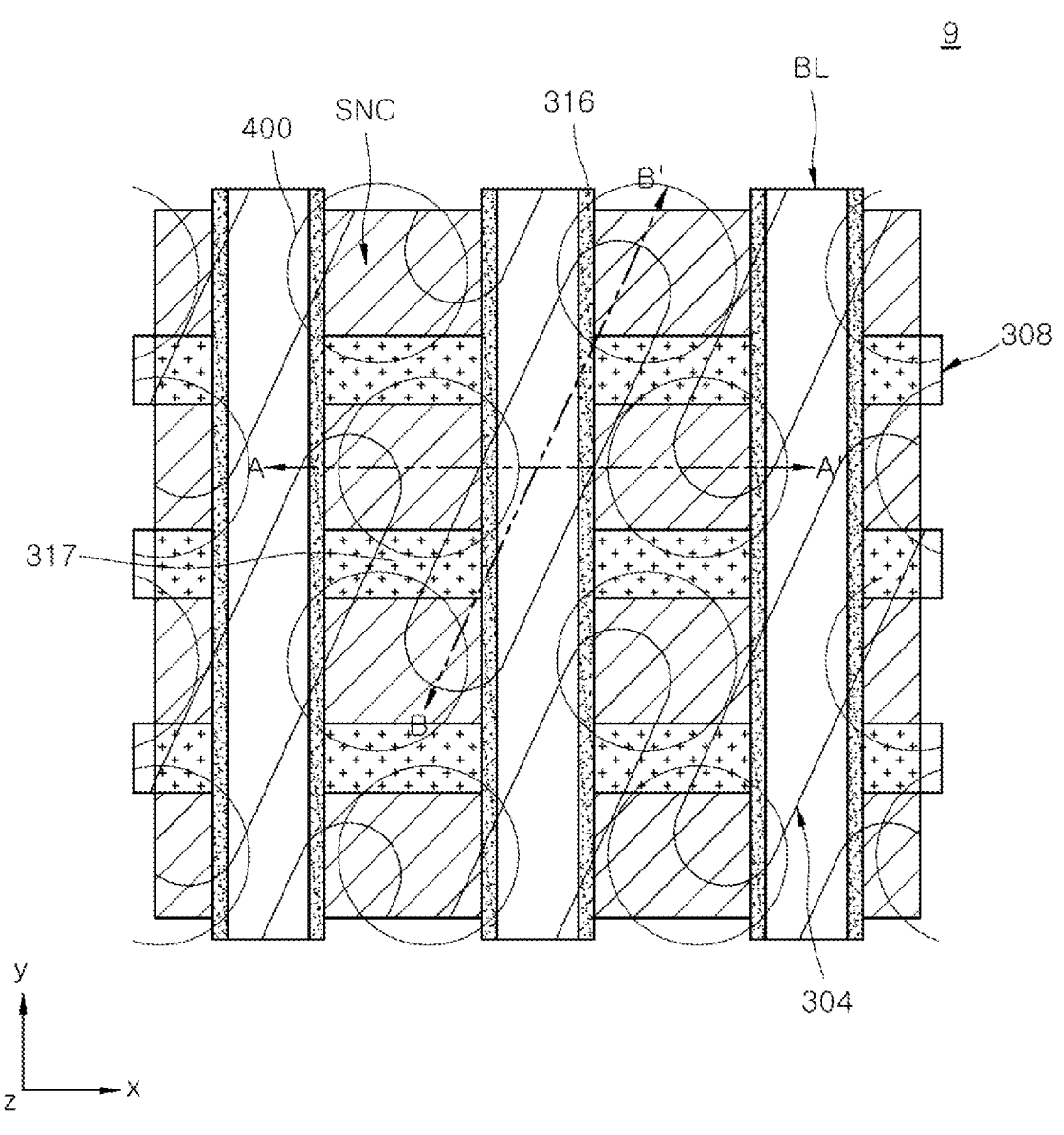
FIG. 14A is a plan view schematically illustrating memory cells of a semiconductor device according to an embodiment of the present disclosure.
Figure 14B:
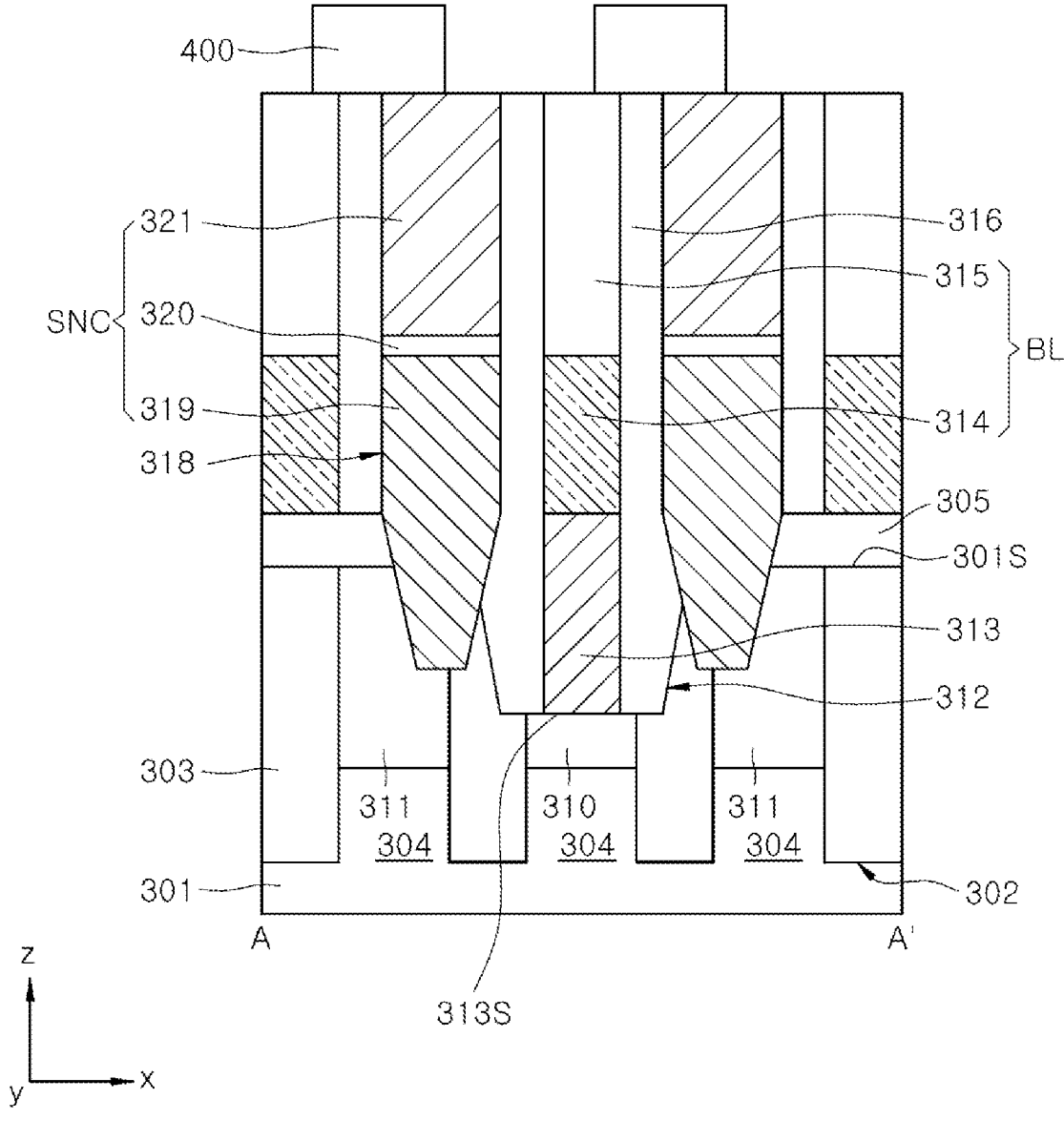
FIG. 14B is a cross-sectional view taken along a line A-A' of a semiconductor device of FIG. 14A.
Figure 14C:
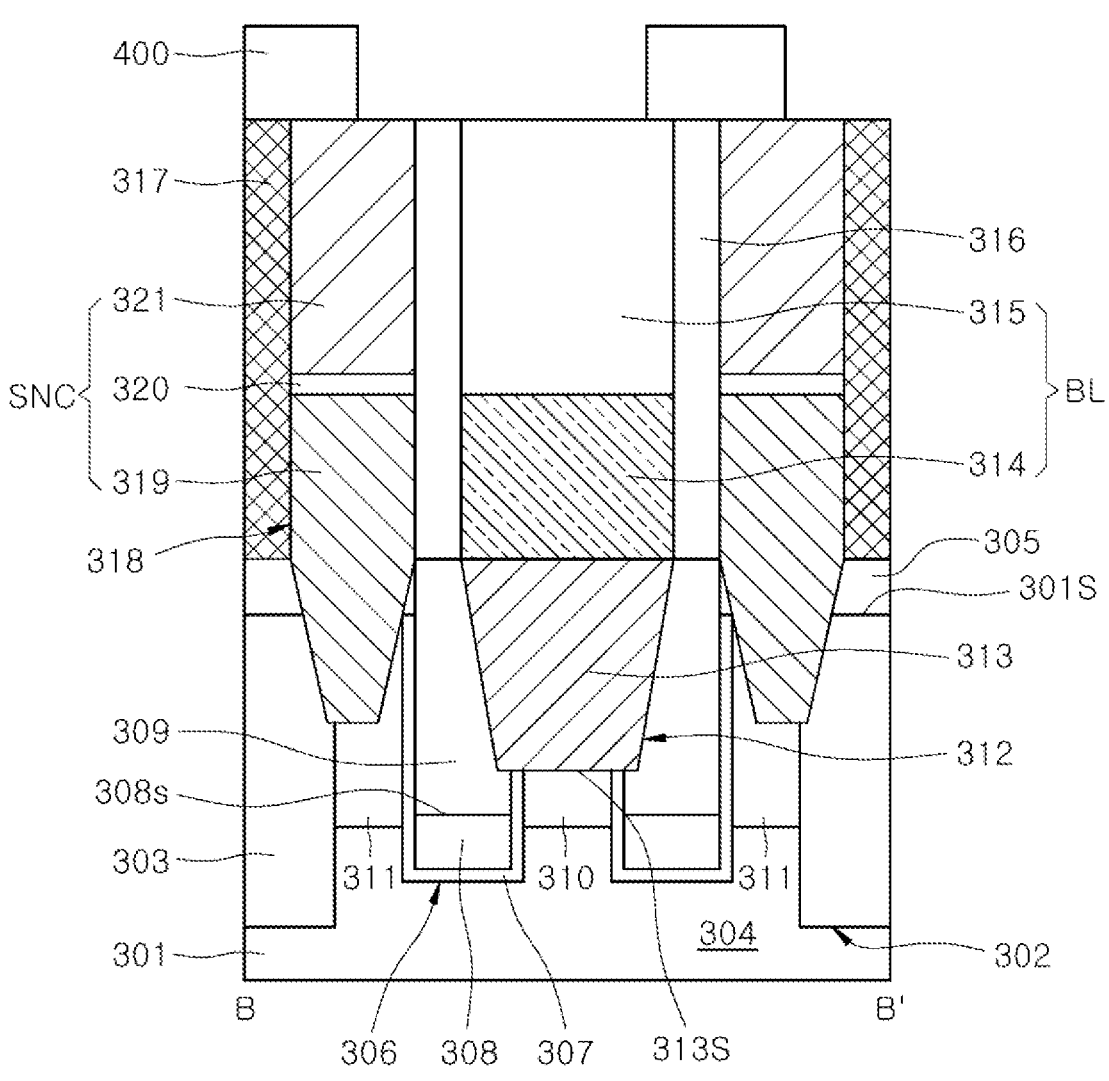
FIG. 14C is a cross-sectional view taken along a line B-B' of a semiconductor device of FIG. 14A.

FIG. 14A is a plan view schematically illustrating memory cells of a semiconductor device according to an embodiment of the present disclosure. FIG. 14B is a cross-sectional view taken along a line A-A' of a semiconductor device of FIG. 14A. FIG. 14C is a cross-sectional view taken along a line B-B' of a semiconductor device of FIG. 14A.

Referring to FIGS. 14A to 14C, a semiconductor device 9 may include a plurality of memory cells. Each of the plurality of the memory cells may include a cell transistor including a buried word line 308. The each of the plurality of the memory cells further includes a bit line 314, and a capacitor 400.

A substrate 301 may include a semiconductor material. The substrate 301 may include device isolation layers 303 and active regions 304. The active regions 304 may be doped with an n-type dopant or a p-type dopant. A cell region of each of the active regions 304 may be doped with a p-type dopant. The active regions 304 may be defined as regions of the substrate 301, separated by the device isolation layers 303. The device isolation layers 303 may be formed by a shallow trench isolation (STI) process, and may be disposed in device isolation trenches 302 formed in the substrate 301.

Referring to FIG. 14C, word line trenches 306 may be formed in the substrate 301. A gate insulation layer 307 may be disposed on an inner surface or sidewall of each of the word line trenches 306. A buried word line 308 may be disposed on the gate insulation layer 307. The buried word line 308 may partially fill each of the word line trenches 306.

A word line capping layer 309 may be disposed on the buried word line 308 in each of the word line trenches 306. An upper surface 308S of the buried word line 308 may be positioned at a lower level than a surface 301S of the substrate 301. The buried word line 308 may include a conductive material. In an embodiment, the buried word line 308 may be a thin film structure including a titanium nitride layer and a tungsten layer. In another embodiment, the buried word line 308 may be made of a single titanium nitride layer or a single tungsten layer.

Referring to FIG. 14B and 14C, first and second doping regions 310 and 311 may be formed in the active regions 304 of the substrate 301. The first and second doping regions 310 and 311 may be spaced apart from each other by the word line trenches 306. One of the first and second doping regions 310 and 311 may be a source region of the cell transistor, and the other one may be a drain region of the cell transistor. The first and second doping regions 310 and 311 may include an N-type dopant such as arsenic (As) or phosphorus (P).

As described above, the buried word line 308 and adjacent first and second doped regions 310 and 311 may constitute a cell transistor. The buried word line 308 may extend in the x-direction of FIG. 14A.

Referring to FIGS. 14B and 14C, a bit line contact plug 313 may be disposed over the substrate 301. The bit line contact plug 313 may be electrically connected to the first doping region 310. The bit line contact plug 313 may be disposed in a bit line contact hole 312. The bit line contact hole 312 may be formed in the substrate 301 and a hard mask layer 305 disposed on the substrate 301. A bottom surface 313S of the bit line contact plug 313 may be positioned at a lower level than the upper surface 301S of the substrate 301. The bit line contact plug 313 may include a conductive material. A bit line structure BL may be disposed on the bit line contact plug 313. The bit line structure BL may include a bit line 314 in contact with the bit line contact plug 313 and a bit line hard mask 315 disposed on the bit line 314.

Referring to FIGS. 14A to 14C, the bit lines 314 may extend in a direction (e.g., y-direction), which crosses the buried word line 308. The bit lines 314 may be electrically connected to the first doping regions 310 through the bit line contact plugs 313. The bit lines 314 may include a conductive material. The bit line hard mask 315 may include an insulating material.

A line spacer 316 may be disposed on a sidewall of the bit line structure BL. The bit line spacer 316 may extend to cover both sidewalls of the bit line contact plug 313. The bit line spacer 316 may include silicon oxide, silicon nitride, or a combination thereof. In an embodiment, the bit line spacer 316 may include an air gap. As an example, the bit line spacer 316 may have a nitride-air gap-nitride (NAN) structure in which an air gap is positioned between silicon nitride layers.

Storage node contact (SNC) plugs may be disposed between the bit line structures BL. The storage node contact plug SNC may be disposed in a storage node contact hole 318. The storage node contact (SNC) plug may be electrically connected to the second doping region 311. In an embodiment, the storage node contact (SNC) plug may include a lower plug 319 and an upper plug 321. The storage node contact (SNC) plug may further include an ohmic contact layer 320 between the lower plug 319 and the upper plug 321. In an embodiment, the upper plug 321 may include metal, the lower plug 319 may include doped silicon, and the ohmic contact layer 320 may include metal silicide.

Referring to FIG. 14C, a plug separation layer 317 may be disposed on the hard mask layer 305. The plug separation layer 317 may be an insulating layer disposed between the adjacent bit line structures BL. Through the plug separation layer 317 and the hard mask layer 305, the storage node contact holes 318 may be formed over the active regions 304.

Referring to FIGS. 14A to 14C, capacitors 400 may be disposed on the storage node contact (SNC) plugs. The capacitor 400 may have a configuration of one of a semiconductor device 1 of FIG. 4, the semiconductor device 2 of FIG. 7, a semiconductor device 3 of FIG. 8, a semiconductor device 4 of FIG. 9, a semiconductor device 5 of FIG. 10, a semiconductor device 6 of FIG. 11, a semiconductor device 7 of FIG. 12, and a semiconductor device 8 of FIG. 13. The configuration of the capacitor 400 will be described in more detail with reference to FIGS. 15A to 17B below.

Figure 15A:
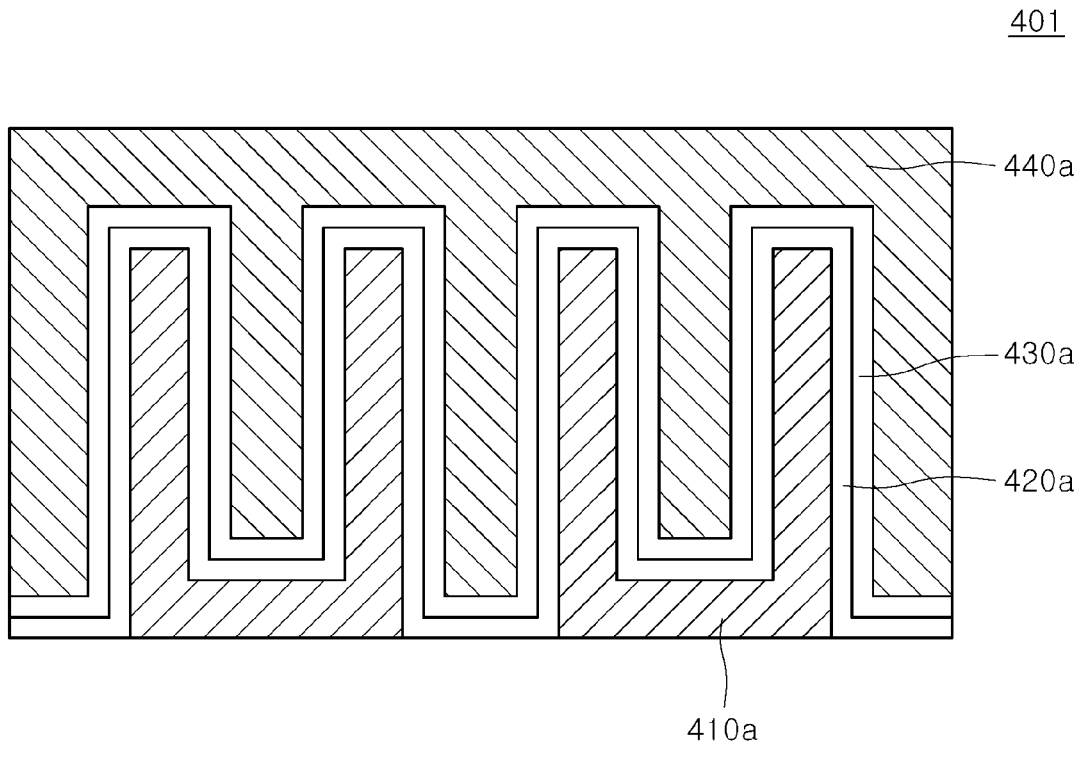
FIGS. 15A and 15B are cross-sectional views schematically illustrating capacitors of a semiconductor device according to an embodiment of the present disclosure.
Figure 15B:
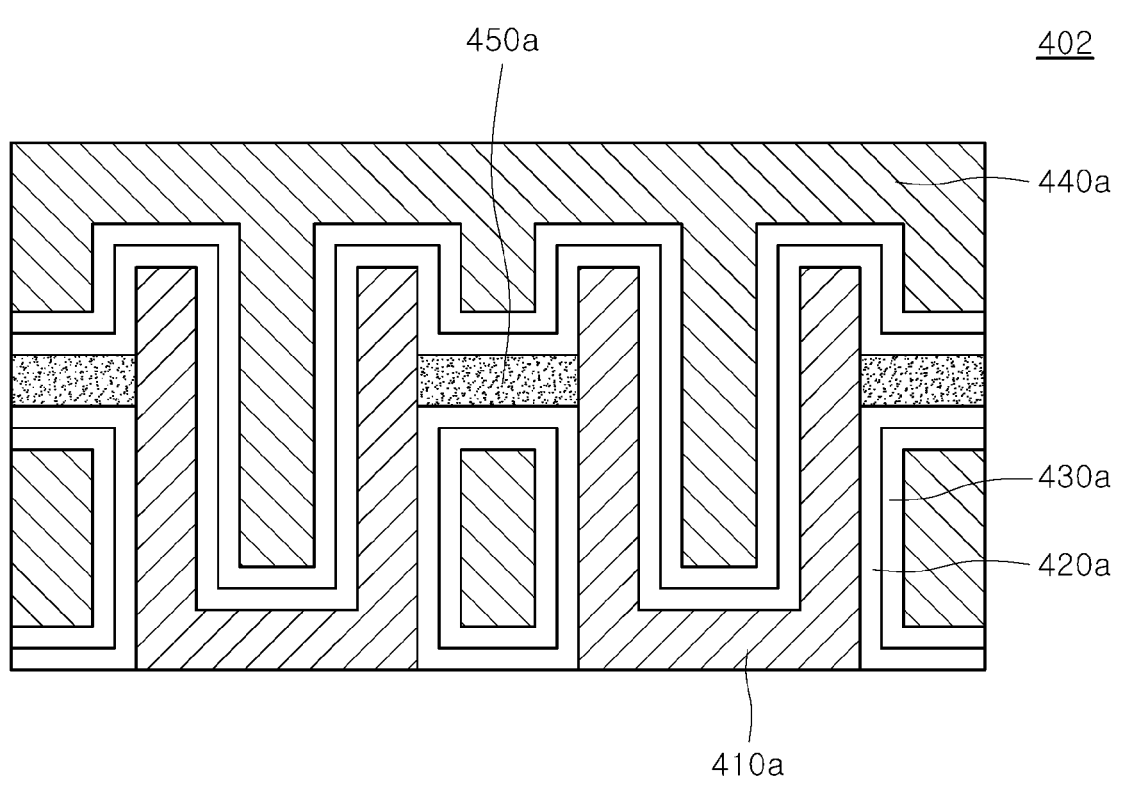

FIGS. 15A and 15B are cross-sectional views schematically illustrating capacitors of a semiconductor device according to an embodiment of the present disclosure. Capacitors 401 or 402 of FIGS. 15A and 15B may be used as a capacitor 400 of a memory cell in a semiconductor device 9 of FIGS. 14A to 14C.

Referring to FIG. 15A, a capacitor 401 may include a storage node electrode 410a, a ferroelectric layer 420a disposed on the storage node electrode 410a, a dielectric structure 430a disposed on the ferroelectric layer 420a, and a plate electrode 440a disposed on the dielectric structure 430a. The storage node electrode 410a may be disposed on the storage node contact (SNC) plug of a memory cell of the semiconductor device 9 described above with reference to FIGS. 14A to 14C. The storage node electrode 410a may be electrically connected to a second doping region of a substrate 301.

Referring to FIG. 15A, the storage node electrode 410a may have a cylindrical shape. The ferroelectric layer 420a may be disposed to cover the storage node electrode 410a having a cylindrical shape. The dielectric structure 430a may be disposed to cover the ferroelectric layer 420a. The plate electrode 440a may be disposed to cover the dielectric structure 430a.

In an embodiment, the capacitor 401 may be a semiconductor device 1 described with reference to FIG. 4. As an example, the storage node electrode 410a and the plate electrode 440a of the capacitor 401 may correspond to the first electrode 110 and the second electrode 140 of the semiconductor device 1. In addition, the ferroelectric layer 420a and the dielectric structure 430a of the capacitor 401 may correspond to the ferroelectric layer 120 and the dielectric structure 130 of the semiconductor device 1.

In another embodiment, the capacitor 401 may be a semiconductor device 2 described with reference to FIG. 7. The semiconductor device 2 of FIG. 7 may further include first and second barrier insulation layers 201 and 202 compared to a semiconductor device 1 of FIG. 4. Correspondingly, the capacitor 401 may further include a first barrier insulation layer disposed between the ferroelectric layer 420a and the dielectric structure 430a (not illustrated), and a second barrier insulation layer disposed between the dielectric structure 430a and the plate electrode 440a (not illustrated).

In yet another embodiment, the capacitor 401 may be a semiconductor device 3 described with reference to FIG. 8. The semiconductor device 3 of FIG. 8 may further include a reduction sacrificial layer 203 compared to a semiconductor device 2 of FIG. 7. Thus, although not illustrated in FIG. 15A, the capacitor 401 may further include a reduction sacrificial layer disposed between a second barrier insulation layer and the plate electrode 440a.

In a further embodiment, the capacitor 401 may be a semiconductor device 4 described with reference to FIG. 9. The semiconductor device 4 of FIG. 9 may further include a third barrier insulation layer 204 compared to a semiconductor device 2 of FIG. 7. Consequently, although not illustrated in FIG. 15A, the capacitor 401 may further include a third barrier insulation layer disposed between the storage node electrode 410a and the ferroelectric layer 420a.

In a still further embodiment, the capacitor 401 may be a semiconductor device 5 described with reference to FIG. 10. The semiconductor device 5 of FIG. 10 may further include a crystallization seed layer 205 compared to the semiconductor device 2 of FIG. 7. Correspondingly, although not illustrated in FIG. 15A, the capacitor 401 may further include a crystallization seed layer disposed between the storage node electrode 410a and the ferroelectric layer 420a.

In an additional embodiment, the capacitor 401 may be a semiconductor device 6 described with reference to FIG. 11. The semiconductor device 6 of FIG. 11 may further include a third barrier insulation layer 204 disposed between the first electrode 110 and the crystallization seed layer 205 compared to a semiconductor device 5 of FIG. 10. Thus, although not illustrated in FIG. 15A, the capacitor 401 may further include a third barrier insulation layer and a crystallization seed layer disposed between the storage node electrode 410a and the ferroelectric layer 420a.

In yet an additional embodiment, the capacitor 401 may be a semiconductor device 7 described with reference to FIG. 12. The semiconductor device 7 of FIG. 12 may be different from a semiconductor device 2 of FIG. 7 in the configuration of a ferroelectric layer 1200. The ferroelectric layer 1200 may include a first sub ferroelectric layer 120a, an inner barrier layer 206, and a second sub ferroelectric layer 120b. By analogy, the ferroelectric layer 420a of FIG.

15A may include a first sub ferroelectric layer, an inner barrier layer, and a second sub ferroelectric layer.

In still an additional embodiment, the capacitor 401 may be a semiconductor device 8 described with reference to FIG. 13. The semiconductor device 8 of FIG. 13 may be different from a semiconductor device 2 of FIG. 7 in the configuration of a dielectric structure 1300. The dielectric structure 1300 may include a first sub dielectric structure 130a, an inner barrier layer 207, and a second sub dielectric structure 130b. Correspondingly, the dielectric structure 430a of FIG. 15A may include a first sub dielectric structure, an inner barrier layer, and a second sub dielectric structure.

Referring to FIG. 15B, a capacitor 402 may further include supporters 450a connecting the storage node electrodes 410a to each other. The supporters 450a may serve to physically support the outer walls of the storage node electrodes 410a. The supporters 450a may improve structural stability for the storage node electrodes 410a. The supporters 450a may include, for example, silicon nitride.

In some embodiments other than embodiments illustrated in FIGS. 15A and 15B, instead of a ferroelectric layer 420a disposed on a storage node electrode 410a and a dielectric structure 430a disposed on a ferroelectric layer 420a, the dielectric structure 430a may be disposed on the storage node electrode 410a, and the ferroelectric layer 420a may be disposed on the dielectric structure 430a. Accordingly, the plate electrode 440a may be disposed on the ferroelectric layer 420a.

Figure 16A:
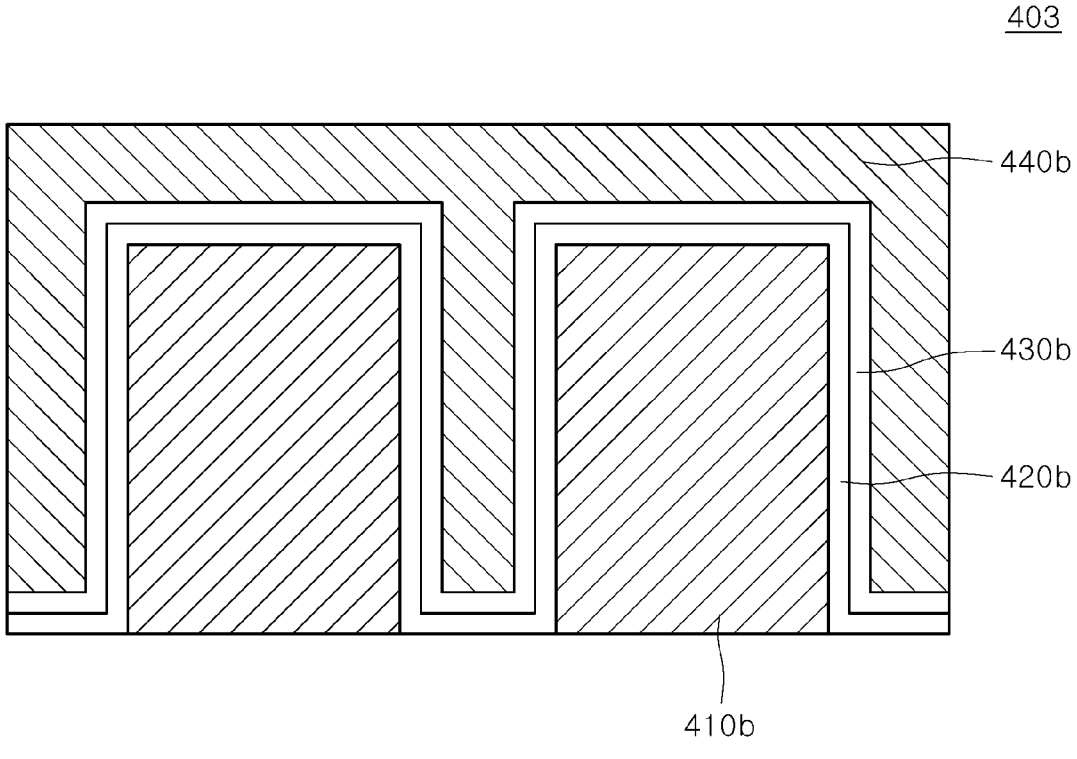
FIGS. 16A and 16B are cross-sectional views schematically illustrating capacitors according to another embodiment of the present disclosure.
Figure 16B:
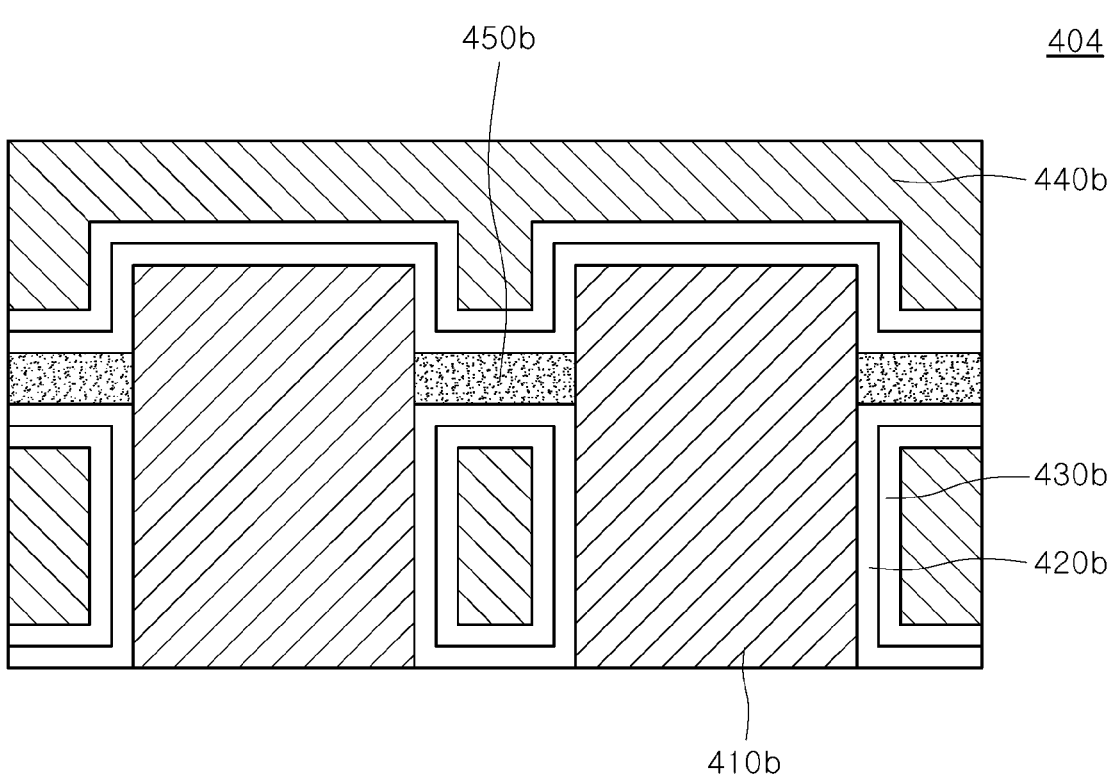

FIGS. 16A and 16B are cross-sectional views schematically illustrating capacitors according to another embodiment of the present disclosure. Capacitors 403 and 404 may be utilized as a capacitor 400 of a memory cell of semiconductor device 9 of FIGS. 14A to 14C.

Referring to FIG. 16A, a capacitor 403 may include a storage node electrode 410b, a ferroelectric layer 420b disposed on the storage node electrode 410b, a dielectric structure 430b disposed on the ferroelectric layer 420b, and a plate electrode 440b disposed on the dielectric structure 430b.

The capacitor 403 may differ from a capacitor 401 of FIG. 15A due to a shape of the storage node electrode 410b. Other elements or components of the capacitor 403, other than the shape of the storage node electrode 410b, may be substantially the same as elements or components of the capacitor 401 of FIG. 15A and a description will not be repeated here. Referring to FIG. 16A, the storage node electrode 410b may have a pillar or pillar-like shape. Accordingly, the ferroelectric layer 420b may be disposed to cover an outer wall surface of the storage node electrode 410b.

Referring to FIG. 16B, compared to a capacitor 403 of FIG. 16A, a capacitor 404 may further include supporters 450b connecting storage node electrodes 410b to each other. The supporters 450b may serve to physically support the outer walls of the storage node electrodes 410b. The supporters 450b may improve the structural stability of the storage node electrodes 410b. The supporters 450b may include, for example, silicon nitride.

Figure 17A:
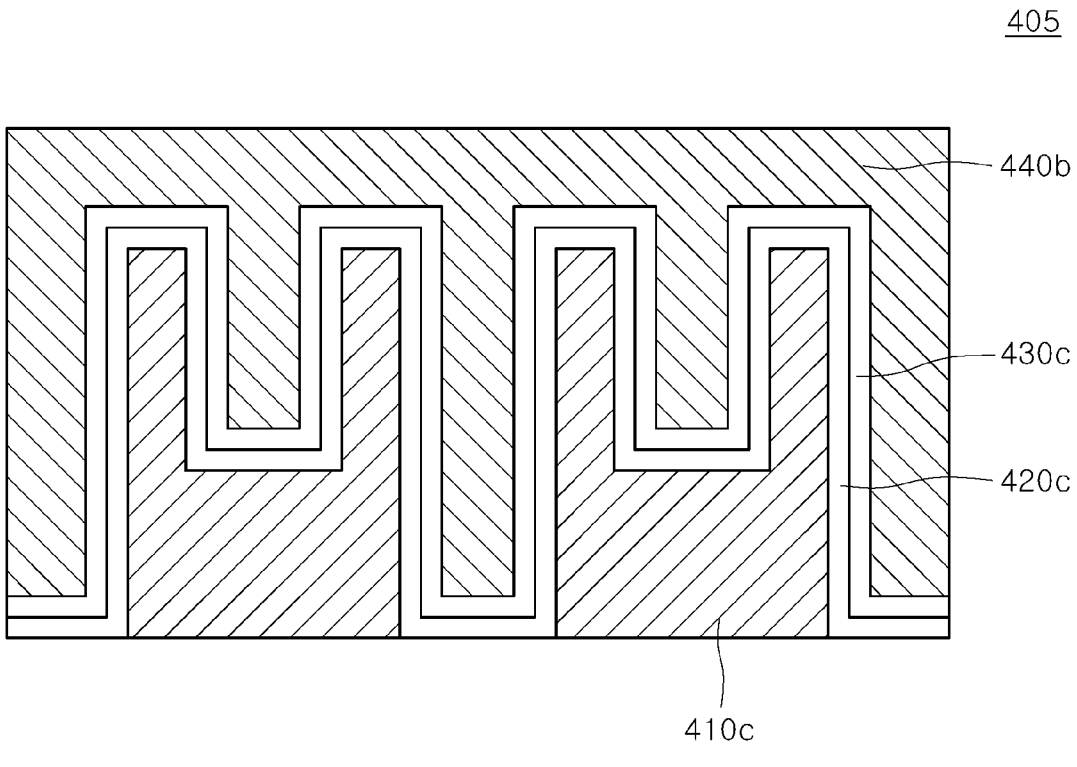
FIGS. 17A and 17B are cross-sectional views schematically illustrating capacitors according to another embodiment of the present disclosure.
Figure 17B:
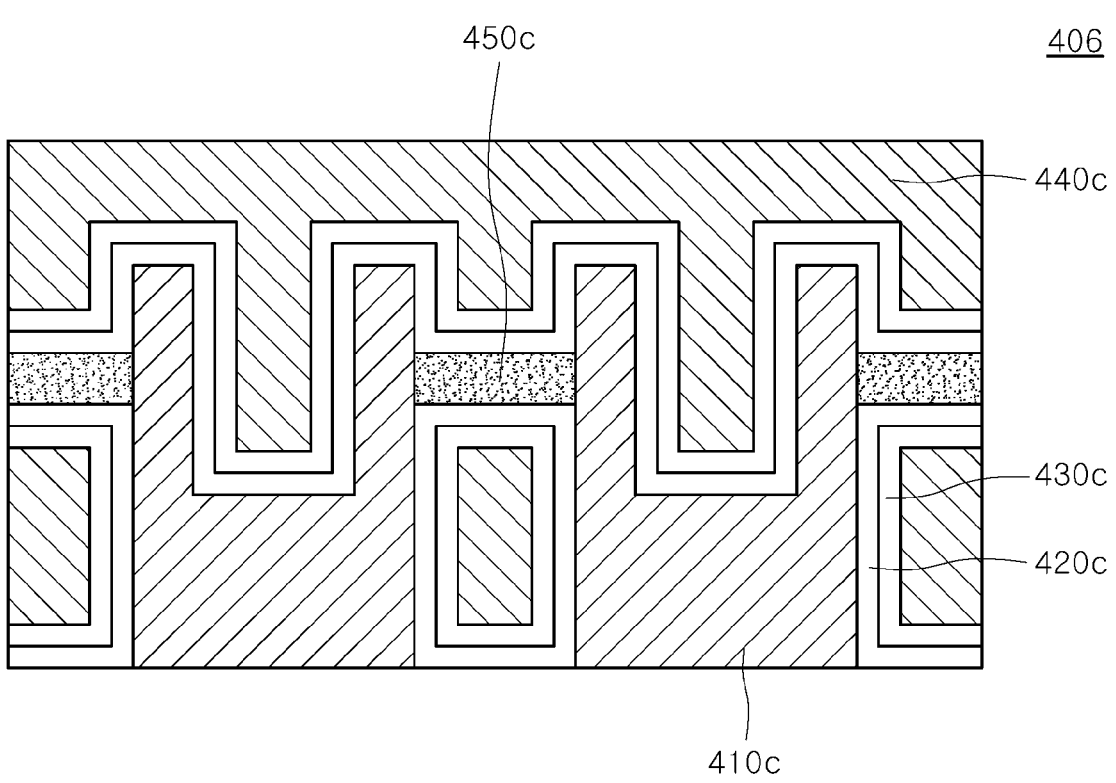

FIGS. 17A and 17B are cross-sectional views schematically illustrating capacitors according to another embodiment of the present disclosure. The capacitors 405 and 406 may be used as a capacitor 400 of a memory cell of a semiconductor device 9 of FIGS. 14A to 14C.

Referring to FIG. 17A, a capacitor 405 may include a storage node electrode 410c, a ferroelectric layer 420c disposed on the storage node electrode 410c, a dielectric structure 430*c* disposed on the ferroelectric layer 420*c*, a plate electrode 440*c* disposed on the dielectric structure 430*c*.

The capacitor 405 may differ from a capacitor 401 of FIG. 15A with respect to the shape of the storage node electrode 410*c*. Other than the shape of the storage node electrode 410*c*, the configuration of the capacitor 405 may be substantially the same as that of the capacitor 401 of FIG. 15A. Referring to FIG. 17A, the shape of the storage node electrode 410*c* may be a combination of a cylindrical shape of a storage node electrode 410*a* illustrated in FIG. 15A and a pillar shape of a storage node electrode 410*b* illustrated in FIG. 16A.

Referring to FIG. 17B, a capacitor 406, compared to a capacitor 405 of FIG. 17A, may further include supporters 450*c* connecting the storage node electrodes 410*c* to each other. The supporters 450*c* may serve to physically support the outer walls of the storage node electrodes 410*c*. The supporters 450*c* may improve the structural stability of the storage node electrodes 410*c*. The supporter 450*c* may include, for example, silicon nitride.

As described above, according to an embodiment of the present disclosure, a semiconductor device may include a ferroelectric layer and a dielectric structure that are disposed between a first electrode and a second electrode and connected in series to each other. The dielectric structure may include first and second dielectric layers that are alternately stacked.

In an embodiment of the present disclosure, the dielectric structure may implement an increased capacitance due to a flexoelectric effect that occurs between the first and second dielectric layers. In addition, the semiconductor device may implement an increased capacitance by pairing a ferroelectric layer having a negative capacitance with a dielectric structure having a positive capacitance. As a result, the semiconductor device can effectively secure an increased capacitance while maintaining a sufficiently low level of leakage current using the ferroelectric layer and the dielectric structure.

Figure 18:
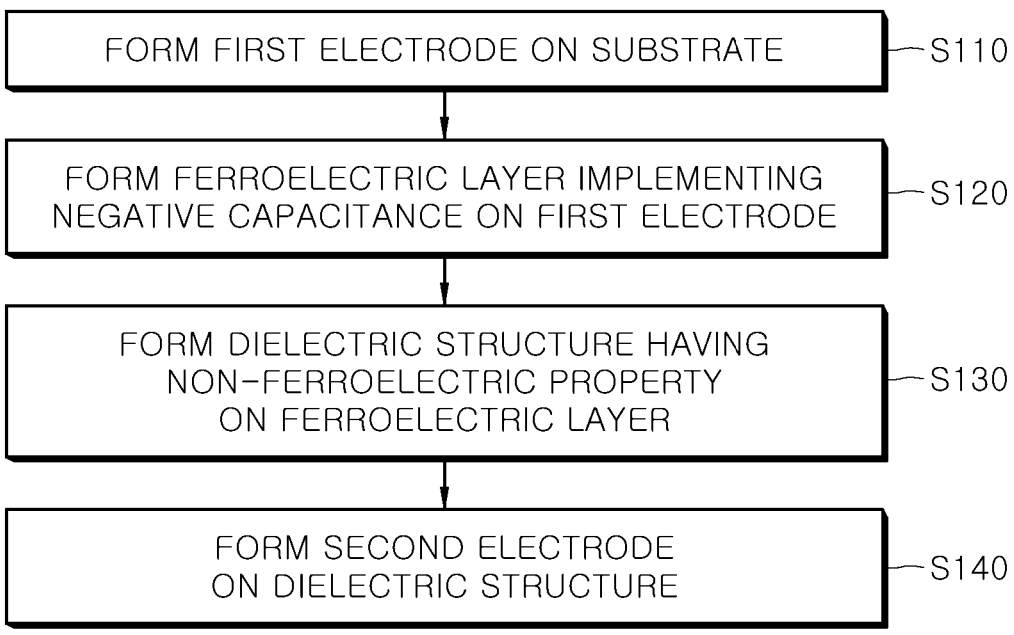
FIG. 18 is a flowchart schematically illustrating a method of manufacturing a semiconductor device according to an embodiment of the present disclosure.

FIG. 18 is a flowchart schematically illustrating a method of manufacturing a semiconductor device according to an embodiment of the present disclosure.

Referring to S110 of FIG. 18, a first electrode may be formed on a substrate. The substrate may include a material capable of being subjected to semiconductor processes. As an example, the substrate may include a semiconductor, a conductor, or an insulator. The first electrode may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first electrode may be formed, for example, by an atomic layer deposition method, a pulsed layer deposition method, or a chemical vapor deposition method.

Referring to S120 of FIG. 18, a ferroelectric layer implementing a negative capacitance may be formed on the first electrode. In an embodiment, the ferroelectric layer may include hafnium oxide, hafnium zirconium oxide, or a combination thereof. In another embodiment, the ferroelectric layer may include hafnium oxide doped with a dopant, hafnium zirconium oxide doped with the dopant, or a combination thereof. The dopant may stabilize the ferroelectric properties of the ferroelectric layer. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

The ferroelectric layer may have a crystalline structure of an orthorhombic crystal system. The ferroelectric layer may have a thickness of, for example, 1 nanometer (nm) to 4 nanometers (nm). The ferroelectric layer may have a single crystalline structure or a polycrystalline structure. In an embodiment, the ferroelectric layer may be an epi-growth layer. The ferroelectric layer may be formed, for example, by an atomic layer deposition method, a pulsed layer deposition method, or a chemical vapor deposition method.

Referring to S130 of FIG. 18, a dielectric structure having non-ferroelectric properties may be formed on the ferroelectric layer. The dielectric structure may have a thickness of, for example, 1 nanometer (nm) to 4 nanometers (nm). The dielectric structure may include first dielectric layers and second dielectric layers that are alternately stacked. Each of the first and second dielectric layers may have a thickness of, for example, 5 angstroms (Å) to 20 angstroms (Å). The dielectric structure may have a superlattice structure that includes the first dielectric layers and the second dielectric layers.

In an embodiment, each of the first and second dielectric layers may be an epi-growth layer having a non-ferroelectric property. As an example, each of the first and second dielectric layers may have paraelectricity. Each of the first and second dielectric layers may be formed, for example, by an atomic layer deposition method, a pulsed layer deposition method, or a chemical vapor deposition method.

In an embodiment, one dielectric layer of the first and second dielectric layers may include hafnium oxide, and the other dielectric layer may include zirconium oxide. In this case, the first dielectric layer may have a crystalline structure of a monoclinic crystal system or a tetragonal crystal system. Similarly, the second dielectric layer may have a crystalline structure of a monoclinic crystal system or a tetragonal crystal system. The first dielectric layer and the second dielectric layer may be formed to have different lattice constants.

In an embodiment, the operation of forming the dielectric structure may include forming a plurality of unit stacks. Each of the plurality of unit stacks may include one layer of the first dielectric layer and one layer of the second dielectric layer.

Referring to S140 of FIG. 18, a second electrode may be formed on the dielectric structure. The second electrode may include a conductive material. The conductive material may include, for example, gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The second electrode may be formed by, for example, an atomic layer deposition method, a pulsed layer deposition method, or a chemical vapor deposition method.

By performing the above-described processes, a semiconductor device according to an embodiment of the present disclosure may be manufactured. The present method may be applied to manufacturing a semiconductor device 1 described with reference to FIG. 4, as an example.

In some embodiments, the method may further include forming a first barrier insulation layer between the ferroelectric layer and the dielectric structure, and forming a second barrier insulation layer between the dielectric structure and the second electrode. In this case, each of the first and second barrier insulation layers may include at least one selected from aluminum oxide, yttrium oxide, and magnesium oxide. By adding the barrier insulation layers in this manner, a semiconductor device 2 described with reference to FIG. 7 may be manufactured.

In some embodiments, the method may further include forming a reduction sacrificial layer between the dielectric structure and the second electrode. In this case, the reduction sacrificial layer may include niobium oxide or titanium oxide. As a result, a semiconductor device 3 described with reference to FIG. 8 may be manufactured.

In some embodiments, the method may further include forming a third barrier insulation layer between the first electrode and the ferroelectric layer. The third barrier insulation layer may include at least one selected from aluminum oxide, yttrium oxide, and magnesium oxide. With these additional processes, a semiconductor device 4 described with reference to FIG. 9 may be manufactured.

In some embodiments, the method may further include forming a crystallization seed layer disposed between the first electrode and the ferroelectric layer to induce crystallization of the ferroelectric layer. The crystallization seed layer may include magnesium oxide or zirconium oxide. Under this method, a semiconductor device 5 described with reference to FIG. 10 may be manufactured. When a semiconductor device 5 includes a third barrier insulation layer disposed between the first electrode and the ferroelectric layer, the crystallization seed layer may be formed between the third barrier layer and the ferroelectric layer. Accordingly, a semiconductor device 6 described with reference to FIG. 11 may be manufactured.

In some embodiments, an operation of forming the ferroelectric layer may include forming a first sub ferroelectric layer on the first electrode, forming an inner barrier layer on the first sub ferroelectric layer, and forming a second sub ferroelectric layer disposed on the inner barrier layer. Through these processes, a semiconductor device 7 described with reference to FIG. 12 may be manufactured.

In some embodiments, an operation of forming the dielectric structure of S130 may further include forming an inner barrier layer disposed between the plurality of unit stacks. By adding such processes, a semiconductor device 8 described above with reference to FIG. 13 may be manufactured.

Figure 19:
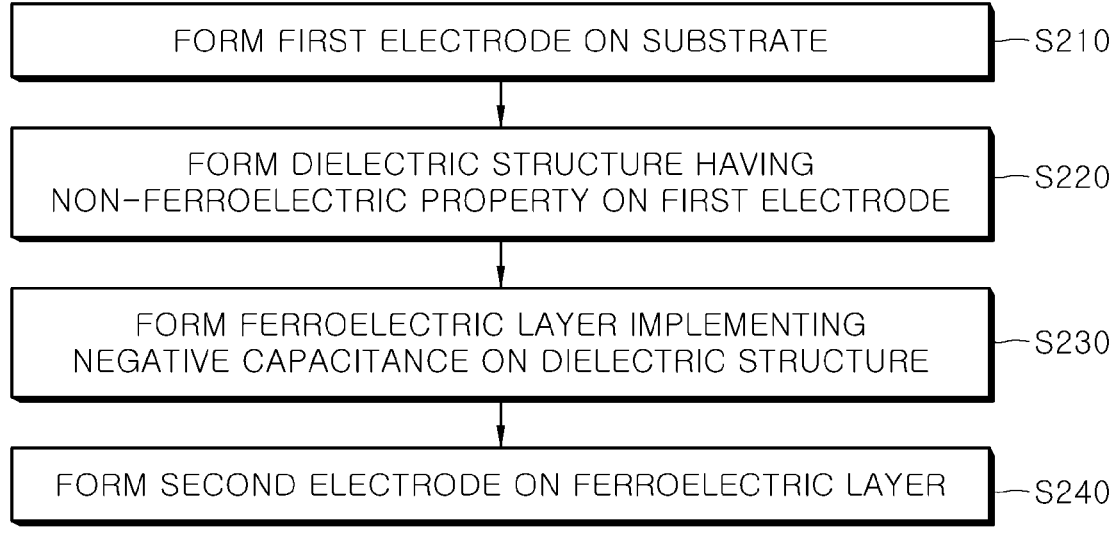
FIG. 19 is a flowchart schematically illustrating a method of manufacturing a semiconductor device according to another embodiment of the present disclosure.

FIG. 19 is a flowchart schematically illustrating a method of manufacturing a semiconductor device according to another embodiment of the present disclosure. In the method of FIG. 19, the order for forming a ferroelectric layer and a dielectric structure may be changed as compared to the method of FIG. 18.

Referring to S210 of FIG. 19, a first electrode may be formed on a substrate. The substrate may include a material capable of being subjected to semiconductor processes. As an example, the substrate may include a semiconductor, a conductor, or an insulator. The first electrode may include a conductive material. The first electrode may be formed, for example, by an atomic layer deposition method, a pulsed layer deposition method, or a chemical vapor deposition method.

Referring to S220 of FIG. 19, a dielectric structure having a non-ferroelectric property may be formed on the first electrode. The operation of forming the dielectric structure may include alternately stacking first dielectric layers and second dielectric layers on the first electrode to form a superlattice structure. In an embodiment, the operation of forming the dielectric structure may include forming the first and second dielectric layers with epi-growth layers on the first electrode. Each of the first and second dielectric layers may be formed, for example, by an atomic layer deposition method, a pulsed layer deposition method, or a chemical vapor deposition method. Each of the first and second dielectric layers may have a thickness of, for example, 5 angstroms (Å) to 20 angstroms (Å).

In an embodiment, the operation of forming the dielectric structure may include forming a plurality of unit stacks. Each of the plurality of unit stacks may include one layer of the first dielectric layer and one layer of the second dielectric layer.

In an embodiment, the operation of forming the dielectric structure may further include forming an inner barrier layer disposed between the plurality of unit stacks.

Referring to S230 of FIG. 19, a ferroelectric layer implementing a negative capacitance may be formed on the dielectric structure. In an embodiment, the operation of forming the ferroelectric layer may include forming a first sub ferroelectric layer on the dielectric structure, forming an inner barrier layer on the first sub ferroelectric layer, and forming a second sub ferroelectric layer on the inner barrier layer. The ferroelectric layer may be formed, for example, by an atomic layer deposition method, a pulsed layer deposition method, or a chemical vapor deposition method.

Referring to S240 of FIG. 19, a second electrode may be formed on the ferroelectric layer. The second electrode may include a conductive material. The second electrode may be formed by, for example, an atomic layer deposition method, a pulsed layer deposition method, or a chemical vapor deposition method.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising;
a first electrode;
a ferroelectric layer disposed on the first electrode that implements a negative capacitance;
a dielectric structure disposed on the ferroelectric layer, the dielectric structure including a first dielectric layer and a second dielectric layer; and
a second electrode disposed on the dielectric structure,
wherein the ferroelectric layer and the dielectric structure are electrically connected in series to each other,
wherein the ferroelectric layer and the dielectric structure together have a non-ferroelectric property, and
wherein the first dielectric layer and the second dielectric layer are alternatively stacked in the dielectric structure.

2. The semiconductor device of claim 1,
wherein the dielectric structure comprises a plurality of unit stacks, and
wherein each of the plurality of unit stacks comprises one layer of the first dielectric layer and one layer of the second dielectric layer.

3. The semiconductor device of claim 2, wherein the dielectric structure further comprises inner barrier layers disposed between the plurality of unit stacks.

4. The semiconductor device of claim 1, wherein each of the first dielectric layer and the second dielectric layer is an epi-growth layer.

5. The semiconductor device of claim 1, wherein each of the first dielectric layer and the second dielectric layer has a thickness of 5 angstroms (Å) to 20 angstroms (Å).

6. The semiconductor device of claim 1, wherein one of the first dielectric layer and the second dielectric layer comprises hafnium oxide, and the other of the first dielectric layer and the second dielectric layer comprises zirconium oxide.

7. The semiconductor device of claim 1, wherein the ferroelectric layer comprises at least one of hafnium oxide and zirconium oxide.

8. The semiconductor device of claim 1, wherein the ferroelectric layer comprises at least one of doped hafnium oxide and doped hafnium zirconium oxide, and wherein the doped hafnium oxide and the doped hafnium zirconium oxide comprises at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

9. The semiconductor device of claim 1, wherein the ferroelectric layer has a thickness of 1 nanometer (nm) to 4 nanometers (nm), and wherein the dielectric structure has a thickness of 1 nanometer (nm) to 4 nanometers (nm).

10. The semiconductor device of claim 1, wherein each of the first electrode and the second electrode comprises at least one selected from gold (Au), silver (Ag), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

11. The semiconductor device of claim 1, further comprising a first barrier insulation layer disposed between the ferroelectric layer and the dielectric structure.

12. The semiconductor device of claim 11, wherein the first barrier insulation layer comprises at least one selected from aluminum oxide, yttrium oxide, and magnesium oxide.

13. The semiconductor device of claim 11, further comprising a second barrier insulation layer disposed between the dielectric structure and the second electrode.

14. The semiconductor device of claim 11, further comprising a reduction sacrificial layer disposed between the dielectric structure and the second electrode.

15. The semiconductor device of claim 14, wherein the reduction sacrificial layer comprises niobium oxide or titanium oxide.

16. The semiconductor device of claim 11, further comprising a crystallization seed layer, disposed between the first electrode and the ferroelectric layer, that induces crystallization of the ferroelectric layer.

17. The semiconductor device of claim 16, wherein the crystallization seed layer comprises magnesium oxide or zirconium oxide.

18. The semiconductor device of claim 16, further comprising a second barrier insulation layer disposed between the crystallization seed layer and the first electrode layer.

19. The semiconductor device of claim 1, wherein the ferroelectric layer comprises:

a first sub ferroelectric layer;

an inner barrier layer disposed on the first sub ferroelectric layer; and a second sub ferroelectric layer disposed on the inner barrier layer.

20. A semiconductor device comprising:

a first electrode;

a ferroelectric layer disposed on the first electrode that implements a negative capacitance;

a dielectric structure disposed on the ferroelectric layer and having a superlattice structure; and a second electrode disposed on the dielectric structure wherein the dielectric structure comprises a plurality of first paraelectric layers and a plurality of second paraelectric layers that are alternately stacked.

21. The semiconductor device of claim 20, wherein each of the plurality of first paraelectric layers and the plurality of second paraelectric layers is an epi-growth layer.

22. The semiconductor device of claim 20, wherein each of the plurality of first paraelectric layers and the plurality of second paraelectric layers has a thickness of 5 angstroms (Å) to 20 angstroms (Å).

23. The semiconductor device of claim 20, wherein the ferroelectric layer has a thickness of 1 nanometer (nm) to 4 nanometers (nm), and wherein the dielectric structure has a thickness of 1 nanometer (nm) to 4 nanometers (nm).

\* \* \* \* \*